United States Patent
Adas et al.

(10) Patent No.: US 10,374,274 B2
(45) Date of Patent: Aug. 6, 2019

(54) INTEGRATED ANTENNAS AND PHASED ARRAYS WITH MODE-FREE ELECTROMAGNETIC BANDGAP MATERIALS

(71) Applicant: The Regents of the University of California, Oakland, CA (US)

(72) Inventors: Enver Adas, Newport Beach, CA (US); Franco De Flaviis, Irvine, CA (US); Nicolaos G. Alexopoulos, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 100 days.

(21) Appl. No.: 15/786,384

(22) Filed: Oct. 17, 2017

(65) Prior Publication Data

US 2018/0108964 A1     Apr. 19, 2018

Related U.S. Application Data

(60) Provisional application No. 62/409,283, filed on Oct. 17, 2016.

(51) Int. Cl.
*H01Q 1/38* (2006.01)
*H01Q 15/00* (2006.01)
(Continued)

(52) U.S. Cl.
CPC .............. *H01P 1/2005* (2013.01); *H01P 3/08* (2013.01); *H01Q 15/006* (2013.01);
(Continued)

(58) Field of Classification Search
CPC . H01P 1/20; H01P 1/2005; H01P 3/08; H01Q 1/38; H01Q 15/00; H01Q 15/008;
(Continued)

(56) References Cited

U.S. PATENT DOCUMENTS

| | | | |
|---|---|---|---|
| 7,522,105 B1 * | 4/2009 | LaComb | H01Q 1/28 343/700 MS |
| 7,679,577 B2 * | 3/2010 | Sotoudeh | H01Q 1/243 343/702 |

(Continued)

OTHER PUBLICATIONS

D. M. Pozar and D. H. Schaubert, "Scan blindness in infinite phased arrays of printed dipoles," IEEE Trans. Antennas Propagat., vol. 32, pp. 602-610, Jun. 1984.

(Continued)

*Primary Examiner* — Tho G Phan
(74) *Attorney, Agent, or Firm* — Nguyen Tarbet

(57) ABSTRACT

A multifunctional electromagnetic structure is presently disclosed. Said structure is a true electromagnetic bandgap ("EBG") material, with both surface and leaky waves suppressed from the whole structure along all lateral directions. It is also an antenna element, configured to radiate to the broadside direction. The structure has two metallization layers of concentric rings between a square-shaped radiating top metal layer and a bottom ground plane. The lower concentric ring is connected to the ground plane through a plurality of vias, while the patch of the top metal layer is fed with a probe. The EBG unit cells may be used as antenna elements in a phased array environment, where they eliminate scan blindness from the array structure along all scan directions.

16 Claims, 11 Drawing Sheets
(9 of 11 Drawing Sheet(s) Filed in Color)

(51) Int. Cl.
| | | |
|---|---|---|
| H01P 1/20 | (2006.01) | |
| H01P 3/08 | (2006.01) | |
| H05K 1/03 | (2006.01) | |
| H01Q 15/14 | (2006.01) | |
| H01Q 21/06 | (2006.01) | |
| H05K 1/02 | (2006.01) | |
| H01Q 21/20 | (2006.01) | |

(52) U.S. Cl.
CPC ....... *H01Q 15/008* (2013.01); *H01Q 15/0086* (2013.01); *H01Q 15/14* (2013.01); *H01Q 21/065* (2013.01); *H01Q 21/205* (2013.01); *H05K 1/0236* (2013.01); *H05K 1/036* (2013.01)

(58) Field of Classification Search
CPC .... H01Q 21/065; H01Q 15/006; H01Q 21/06; H01Q 21/205; H05K 1/02; H05K 1/03
See application file for complete search history.

(56) References Cited

U.S. PATENT DOCUMENTS

| | | | | |
|---|---|---|---|---|
| 9,019,160 | B2* | 4/2015 | Sharawi | H01Q 21/28 343/700 MS |
| 9,030,360 | B2* | 5/2015 | Jerauld | H01Q 1/52 343/700 MS |
| 10,181,646 | B2* | 1/2019 | Celik | H01Q 9/0407 |
| 2006/0152430 | A1* | 7/2006 | Seddon | H01Q 1/241 343/909 |
| 2008/0062059 | A1* | 3/2008 | Freni | H01Q 1/1221 343/840 |

OTHER PUBLICATIONS

D. M. Pozar and D. H. Schaubert, "Analysis of an infinite array of rectangular microstrip patches with idealized probe feeds," IEEE Trans. Antennas Propagat., vol. 32, pp. 1101-1107, Oct. 1984.
D. M. Pozar, "Analysis of finite phased arrays of printed dipoles," IEEE Trans. Antennas Propagat., vol. 33, pp. 1045-1053, Oct. 1985.
D. M. Pozar, "Finite phased arrays of rectangular microstrip patches," IEEE Trans. Antennas Propagat., vol. 34, pp. 658-665, May 1986.
C.-C. Liu, A. Hassel, and J. Shmoys, "Performance of probe-fed microstrip-patch element phased arrays," IEEE Trans. Antennas Propagat., vol. 36, pp. 1501-1509, Nov. 1988.
V. B. Erturk, O. Bakir, R. G. Rojas, and B. Guner, "Scan blindness phenomenon in conformal finite phased arrays of printed dipoles," IEEE Trans. Antennas Propag., vol. 54, pp. 1699-1708, Jun. 2006.
D. M. Pozar, "Scanning characteristics of infinite arrays of printed antenna subarrays," IEEE Trans. Antennas Propagat., vol. 40, pp. 666-674, Jun. 1992.
R. B. Waterhouse, "Improving the scan performance of probe-fed microstrip patch arrays on high dielectric constant substrates," IEEE Trans. Antennas Propagat., vol. 43, pp. 705-712, Jul. 1995.
R. B. Waterhouse, "The use of shorting posts to improve the scanning range of probe-fed microstrip patch phased arrays," IEEE Trans. Antennas Propag., vol. 44, No. 3, pp. 302-309, Mar. 1996.
W. J. Tsay and D. M. Pozar, "Radiation and scattering from infinite periodic printed antennas with inhomogeneous media," IEEE Trans. Antennas Propagat., vol. 46, pp. 1641-1650, Nov. 1998.
R. L. Chen, D. R. Jackson, J. T. Williams, and S. A. Long "Scan impedance of RSW microstrip antennas in finite array," IEEE Trans. Antennas Propagat., vol. 53, pp. 1098-1104, Mar. 2005.
T. Crepin, J. P. Martinaud, T. Dousset, P. Rodriguez-Ulibarri, M. Beruete, C. Loecker, T. Bertuch, J. A. Marcotegui, and S. Maci, "Blind spot mitigation in phased array antenna using metamaterials," IEEE Int. Radar Conf., 2014.
M. C. Tang, S. Xiao, B. Wang, J. Guan, and T. Deng, "Improved performance of a microstrip phased array using broadband and ultralow-loss metamaterial slabs,", IEEE Antennas Propagat. Mag., vol. 53, pp. 31-41, Dec. 2011.
H. Moghadas, A. Tavakoh, and M. Salehi, "Elimination of scan blindness in microstrip scanning array antennas using defected ground structure," AEU-Int. J. Electron. Commun., vol. 62, pp. 155-158, 2008.
D B. Hou, S. Xiao, B. Z. Wang, L. Jiang, J. Wang, and W. Hong, "Elimination of scan blindness with compact defected ground structures in microstrip phased array," IET Microw. Antennas Propag., vol. 3, pp. 269-275, Mar. 2009.
M. H. Awida, A. H. Kamel, and A. E. Fathy, "Analysis and design of wide-scan angle wide-band phased arrays of substrate-integrated cavity backed patches ," IEEE Trans. Antennas Propag., vol. 61, pp. 3034-3041, Jun. 2013.
P. K. Kelly, L. Diaz, M. Piket-May, and I. Rumsey, "Investigation of scan blindness mitigation using photonic bandgap structure in phased arrays," in Proc. SPIE, vol. 3464, Jul. 1999, pp. 239-248.
L. Zhang, J. A. Castaneda, and N. G. Alexopoulos, "Scan blindness free phased array design using PBG materials," IEEE Trans. Antennas Propagat., vol. 52, pp. 2000-2007, Aug. 2004.
Y. Fu and N. Yuan, "Elimination of scan blindness in phased array of microstrip patches using electromagnetic bandgap materials," IEEE Antennas Wireless Propag. Lett., vol. 3, pp. 63-65, 2004.
Z. Iluz, R. Shavit, and R. Bauer, "Microstrip antenna phased array with electromagnetic bandgap substrate," IEEE Trans. Antennas Propagat., vol. 52, pp. 1446-1453, Jun. 2004.
G. Donzelli, F. Capolino, S. Boscolo, and M. Midrio, "Elimination of scan blindness in phased array antenna using a grounded-dielectric EBG material," IEEE Antennas Wireless Propag. Lett., vol. 6, pp. 106-109, 2007.
M. S. M. Isa, R. J. Langley, S. Khamas, A. A. M. Isa, M. Zin, Z. Zakaria, N. Z. Haron, and A. Ahmad, "A technique of scan blindness elimination for planar phased array antenna using miniaturized EBG," Jurnal Teknologi, vol. 69, pp. 11-15, Mar. 2014.
Y.-Y. Bai, S. Xiao, M.-C. Tang, Z.-F. Ding, and B.-Z. Wang, "Wide-angle scanning phased array with pattern reconfigurable elements," IEEE Trans. Antennas Propag., vol. 59, No. 11, pp. 4071-4076, Nov. 2011.
R. Wang, B.-Z. Wang, X. Ding, and X.-S. Yang, "Planar phased array with wide-angle scanning performance based on the image theory," IEEE Antennas Wireless Propag. Lett., vol. 63, pp. 3908-3917, Sep. 2015.
S. E. Valavan, D. Iran, A. G. Yarovoy, and A. G. Roederer, "Dual-band wide-angle scanning planar phased array in X/Ku-bands," IEEE Trans. Antennas Propag., vol. 62, No. 5, pp. 2514-2521, May 2014.
R.-L. Xia, S.-W. Qu, X. Bai, Q. Jiang, S. Yang, and Z.-P. Nie, "Experimental investigation of wide-angle impedance matching of phased array using overlapped feeding network," IEEE Antennas Wireless Propag., vol. 13, pp. 1284-1287, Jul. 2014.
J. A. Kasemodel, C. C. Chen, and J. L. Volakis, "Wideband planar array with integrated feed and matching network for wide-angle scanning," IEEE Trans. Antennas Propagat., vol. 61, pp. 4528-4537, Sep. 2013.
M. Li, S. Q. Xiao, and B. Z. Wang, "Investigation of using high impedance surfaces for wide-angle scanning arrays," IEEE Trans. Antennas Propagat., vol. 63, pp. 2895-2901, Jul. 2015.
D. Sievenpiper, L. Zhang, R. F. J. Broas, N. G. Alexopoulos, and E. Yablonovitch, "High-impedance electromagnetic surfaces with a forbidden frequency band," IEEE Trans. Microwave Theory and Techniques, vol. 47, pp. 2059-2074, Nov. 1999.
F. R. Yang, K. P. Ma, Y. Qian, and T. Itoh, "A novel TEM waveguide using uniplanar compact photonic-bandgap (UC-PBG) structure," IEEE Trans. Microwave Theory and Techniques, vol. 47, pp. 2092-2098, Nov. 1999.
H. Y. D. Yang, R. Ki, and D. R. Jackson, "Design consideration for modeless integrated circuit substrates using planar periodic patches," IEEE Trans. Microwave Theory and Techniques, vol. 48, pp. 2233-2239, Dec. 2000.
C. A. Kyriazidou, H. F. Contopanagos, and N. G. Alexopoulos, "Space-frequency projection of planar AMCs on integrated for 60 GHz radios," IEEE Trans. Antennas Propagat., vol. 60, pp. 1899-1909, Apr. 2012.

(56) References Cited

OTHER PUBLICATIONS

A. Vallecchi, J. R. De Luis, F. Capolino, and F. De Flaviis, "Low profile fully planar folded dipole antenna on a high impedance surface," IEEE Trans. Antennas Propagat., vol. 60, pp. 51-62, Jan. 2012.

N. G. Alexopoulos and D. R. Jackson "Fundamental superstrate (cover) effects on printed circuit antennas," IEEE Trans. Antennas Propag., vol. 32, pp. 807-816, Aug. 1984.

D. F. Sievenpiper, "Forward and backward leaky wave radiation with large effective aperture from an electronically unable textured surface," IEEE Trans. Antennas Propagat., vol. 53, No. 1, pp. 236-247, Jan. 2005.

J. Liang and H.-Y. D. Yang, "Radiation characteristics of a microstrip patch over an electromagnetic bandgap surface," IEEE Trans. Antennas Propag., vol. 55, No. 6, pp. 1691-1697, Jun. 2007.

D. M. Pozar, "The active element pattern," IEEE Trans. Antennas Propagat., vol. 42, pp. 1176-1178, Aug. 1994.

D. F. Kelley and W. L Stutzman "Array antenna pattern modeling methods that include mutual coupling effects," IEEE Trans. Antennas Propagat., vol. 41, pp. 1625-1632, Dec. 1993.

E. Adas, "Integrated microstrip antennas and phased arrays with mode-free electromagnetic bandgap materials for scan blindness elimination," PhD dissertation, University of California, Irvine, 2016.

E. Adas, F. De Flaviis, N. G. Alexopoulos, "Integrated microstrip antennas and phased arrays with mode-free electromagnetic bandgap materials for scan blindness elimination," Electromagn., 37 (1), 1-16.

E. Adas, F. De Flaviis, N. G. Alexopoulos, "Mode-free electromagnetic bandgap materials with broadside radiation," IEEE Trans. Microw. Theory Tech., vol. 31, pp. 433-446, 2017.

E. Adas, F. De Flaviis, N. G. Alexopoulos, "Scan Blindness-Free Electromagnetic Bandgap Phased Arrays," IEEE International Symposium on Antennas and Propagation, pp. 1593-1594, 2017.

\* cited by examiner

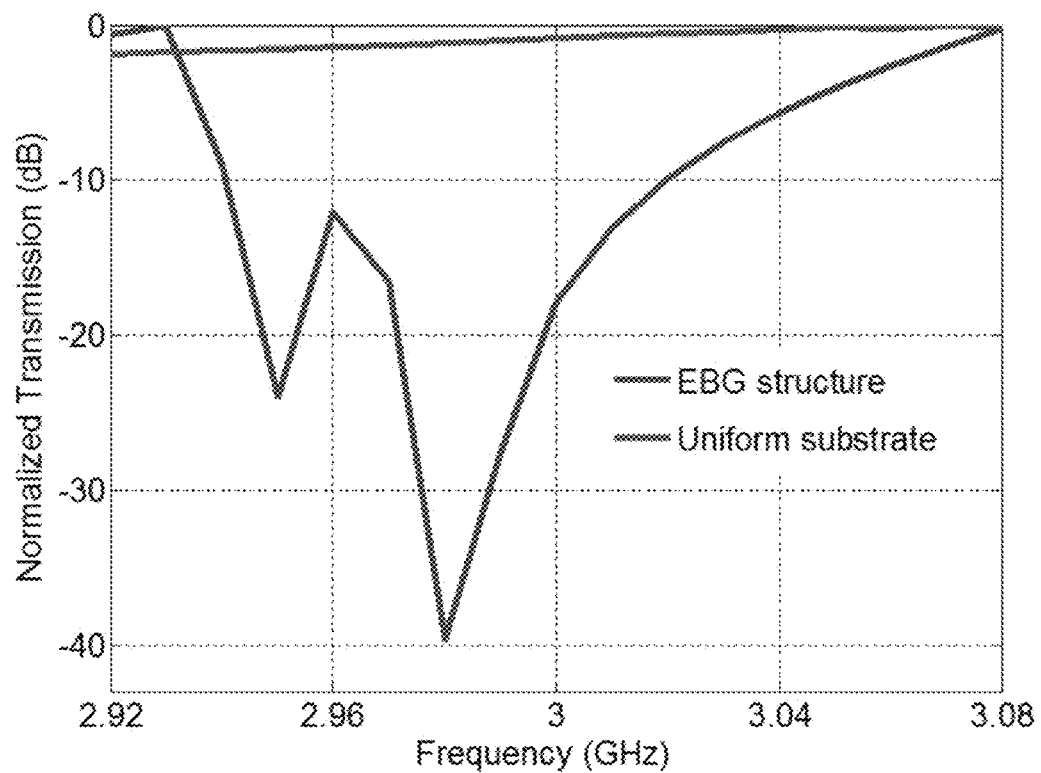
FIG. 4
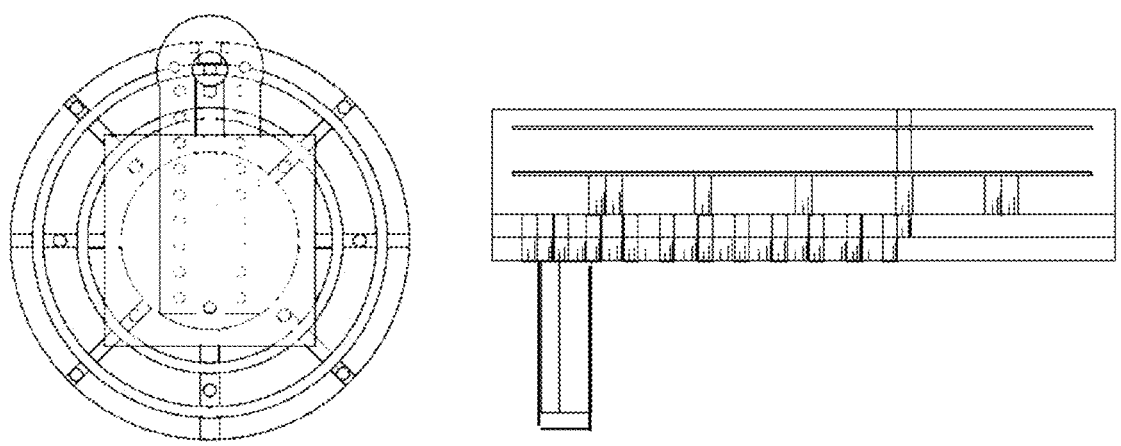
FIG. 5A
FIG. 5B

INTEGRATED ANTENNAS AND PHASED ARRAYS WITH MODE-FREE ELECTROMAGNETIC BANDGAP MATERIALS

CROSS REFERENCE

This application claims priority to U.S. Patent Application No. 62/409,283, filed Oct. 17, 2016, the specification(s) of which is/are incorporated herein in their entirety by reference.

FIELD OF THE INVENTION

The present invention relates to microstrip phased antenna arrays and electromagnetic bandgap materials, and more particularly, to mode-free antenna elements along the lateral directions for scan blindness-free phased arrays.

BACKGROUND OF THE INVENTION

The scan blindness phenomenon [1-6] is a fundamental limitation of microstrip phased arrays. Its elimination is essential to sustain communication links between wide scan angle wireless systems. Even though it is a well-known problem attributed to the coherent coupling between substrate modes and array radiation, its elimination has remained a challenge. In fact, several different approaches have been utilized to completely eliminate it or improve array scan characteristics, each of these approaches has certain limitations on array performance. These limitations include use of: subarrays of elements to distort coherent coupling [7], active devices with parasitic patches and shorting metallic post loaded substrates [8-9], inhomogeneous substrates [10], reduced surface wave antenna elements [11], metamaterials [12-13], defected ground structures [14-15], substrate integrated waveguides [16], and electromagnetic bandgap ("EBG") materials [17-23]. Further, designs for increasing the scan volume of the arrays by modifying feeding structures or elements [24-27], using novel array elements [28], and taking advantage of excited substrate modes [29] have been utilized. Among these approaches, EBG materials improved scan characteristics the most. In fact, other techniques may improve scan range or partially eliminate blindness along certain directions, but use of EBG materials [30-32] provides omnidirectional frequency bands where surface waves are eliminated along all directions. They are thus the state of the art materials for integrated phased arrays.

Integration of microstrip phased arrays and EBG materials for scan blindness elimination have been avoided because of the coupling of the array and bandgap metallization for performance protection of the isolated structures. Bandgap materials and array elements were characterized separately first, then integrated. For example, in [19-20] authors placed EBG cells away from the array elements to reduce coupling between them. EBG cells surrounded by lossy materials have also been used to suppress higher order modes due to interactions between EBG and antenna elements [23]. Microstrip dipole antenna elements, on the other hand, have been directly printed between EBG cells without devoting room to the radiating elements [18]. Element spacing of scanning arrays is typically of a half wavelength or smaller at the upper edge of the operating frequency band in order to avoid grating lobes in the visible scan ranges. Conventional EBG techniques to remedy scan blindness via said element spacing make the surface of the integrated array structure a metallic cover. These techniques also degrade radiation characteristics of the antenna elements by using lossy materials or smaller radiating elements. A complete solution, for integrating EBG materials and planar phased arrays, that removes bandgap metallization from the radiator layer (to eliminate antenna element size constraints), improves radiation efficiency, and beneficially uses EBG/antenna element interactions has remained a challenge. Artificial magnetic conductors ("AMC") have been effectively used for suppressing surface waves while projecting AMC behavior in space [33]. Projecting AMC behavior in space is an efficient way to take into account interactions between artificial substrate metallization and antenna elements while improving performance. AMC structures, co-designed with radiating elements, are good candidates for antennas [34] and broadside arrays [33]. Similarly, superstrate materials, designed as an integral part of the radiating structures, have also shown the ability to suppress surface waves from broadside arrays [35]. However, substrate wave elimination must be achieved for all scan angles for phased arrays. Therefore, EBG materials are the most efficient choice.

Surface wave effects and their suppression using EBG structures have been well studied in the context of scan blindness. Suppression of leaky waves also propagate within printed array substrates and potentially induce scan blindness and mutual coupling between array elements. Suppression of these waves have not been investigated within the context of mitigating scan blindness in microstrip phased arrays. A true integrated structure must offer elimination capabilities for both types of substrate waves, i.e., surface and leaky waves. Even though such modeless EBG structures have been proposed in [32], their integration with practical scanning microstrip phased arrays has not been investigated.

It is important to note that radiating structures based on conventional bandgap materials [36-37] cannot be applied to eliminating scan blindness, since the radiating mode (used to characterize the antenna radiation) propagates in the substrate and couples elements. Hence, these structures cannot function as isolated radiating elements that form phased arrays with suppressed mutual coupling or scan blindness. Another type of bandgap material, known as modeless EBG [32], is mode-free along the lateral directions. However, this material does not provide radiation along the broadside direction (i.e., the direction perpendicular to the material) and thus cannot be used as an isolated antenna element to form phased arrays.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

SUMMARY OF THE INVENTION

The present invention features a novel bandgap-antenna structure configured to operate as an antenna element integrating mode-free omnidirectional bandgap behavior. In some embodiments, the bandgap-antenna structure comprises: an antenna layer disposed on a top surface of a solid cubic substrate; an upper embedded metallic layer disposed within the substrate below the antenna layer; a lower embedded metallic layer electrically coupled to and disposed below the upper embedded metallic layer; and a backing ground plane operatively coupled to a bottom surface of the substrate.

In other embodiments, the antenna layer comprises a metallic patch having a square geometry. In further embodiments, an excitation probe feeds the metallic patch with energy within a given antenna frequency region. The metallic patch may radiate the energy in a direction perpendicular to the bandgap-antenna structure. In exemplary embodiments, the given antenna frequency region and a bandgap frequency region, within which an operating bandgap frequency of said structure lies, overlap so that the mode-free omnidirectional bandgap behavior is exhibited during said energy radiation by said antenna layer (103).

Existing methods and structures incorporating bandgap behavior for eliminating scan blindness and suppressing element coupling in planar phased arrays are ineffective as they degrade radiation characteristics of the antenna elements by using lossy materials or smaller radiating elements. The present invention discloses a bandgap-antenna structure capable of integrating mode-free bandgap behavior into radiating energy, when used as an antenna element. This integration suppresses element coupling in the substrate and eliminates scan blindness when used in planar phased arrays, while also removing bandgap metallization from the radiating layer. Removing said metallization effectively eliminates the antenna element size constraints presently limiting existing methods and structures. It is to be noted that the complete, four-layer structure of the present invention as a whole allows for the integration of EBG materials and antenna elements; along with geometric, size and spacing ranges of the elements comprising said structure.

DEFINITIONS

As used herein, the term "via" refers to an electrical connection between layers in a physical electronic circuit that goes through the plane of one or more adjacent layers. This term is not to be confused with the preposition via defined generally as "by way or means of." Context will suffice in distinguishing the noun (as presently defined) from the preposition.

As used herein, the term "mode" refers to a path traversed, often through a substrate or waveguide, by radiating energy.

As used herein, the term "rotationally symmetric" refers to a characteristic of two objects, where said objects are symmetric when one of the objects is rotated a given number of degrees.

BRIEF DESCRIPTION OF THE DRAWINGS

This patent application contains at least one drawing executed in color. Copies of this patent or patent application publication with color drawing(s) will be provided by the Office upon request and payment of the necessary fee.

The features and advantages of the present invention will become apparent from a consideration of the following detailed description presented in connection with the accompanying drawings in which:

FIG. 4 shows the transmission from seven unit elements for uniform and bandgap-antenna structures.

FIG. 5A shows a top view of a radiating-bandgap structure with a coax feed, through a coax to stripline transition, and stripline matching network.

FIG. 5B shows a side view of a radiating-bandgap structure with a coax feed, through a coax to stripline transition, and stripline matching network.

DETAILED DESCRIPTION OF THE INVENTION

Figure 1A:
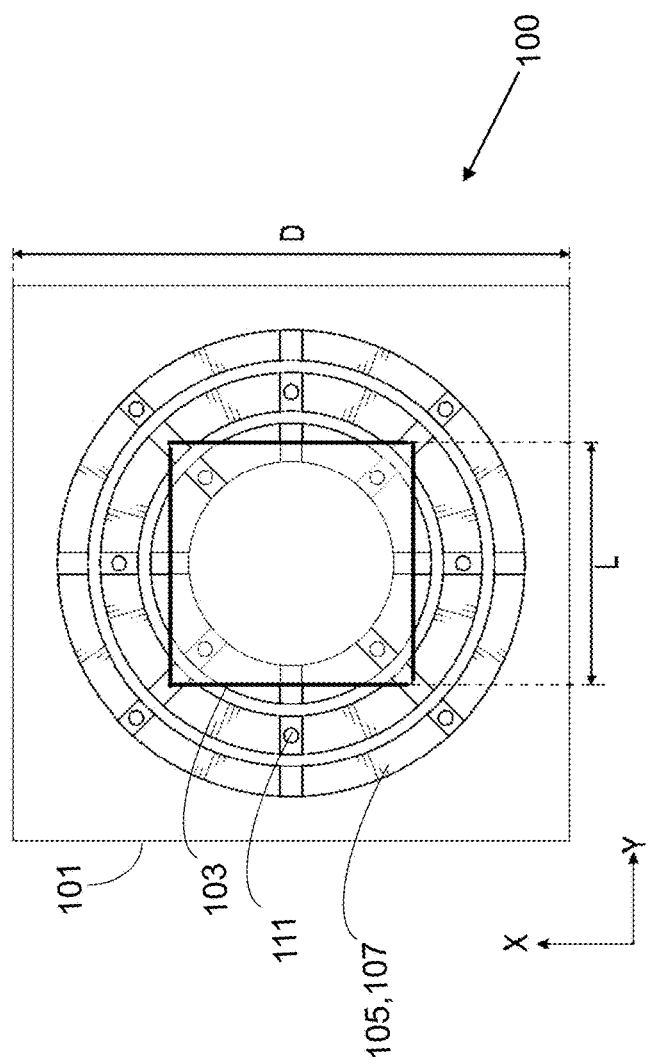
FIG. 1A shows a top view of a unit cell of the multilayer multifunctional bandgap-antenna structure.
Figure 1B:
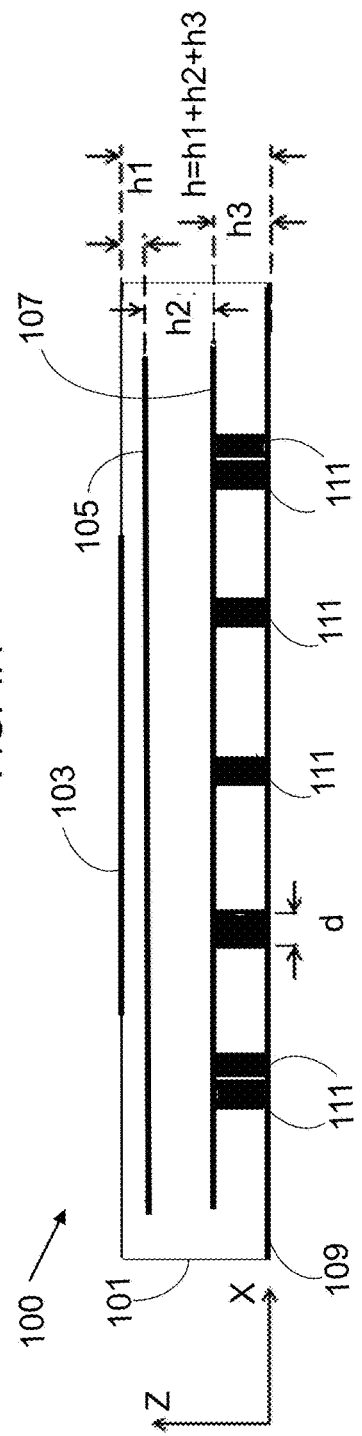
FIG. 1B shows a cross-sectional view of a unit cell of the multilayer multifunctional bandgap-antenna structure.
Figure 1C:
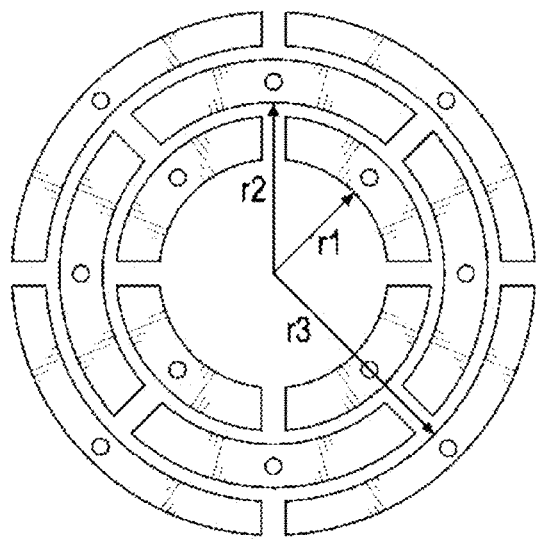
FIG. 1C shows a top view of the concentric rings with vias.

Referring now to FIGS. 1A-14, the present invention features a novel bandgap-antenna structure (100) configured to operate as an antenna element integrating mode-free omnidirectional bandgap behavior. Said integration effectively eliminates the effects of substrate waves. For example, scan blindness is eliminated when the bandgap-antenna structure is used as a phased array.

In some embodiments, the bandgap-antenna structure (100) comprises: an antenna layer (103) disposed on a top surface of a substrate (101); an upper embedded metallic layer (105) disposed within the substrate (101) below the antenna layer; a lower embedded metallic layer (107) electrically coupled to and disposed below the upper embedded metallic layer (105); and a backing ground plane (109) operatively coupled to a bottom surface of the substrate (101). The antenna layer (103), the upper and lower embedded metallic layers (105,107), and the backing ground plane (109) may be aligned such that a center of each is disposed along an axis normal to the substrate (101).

In one embodiment, the substrate (101) is a solid cube having a height, D, close to a half-wavelength of a phased array frequency lying within a bandgap frequency region. In another embodiment, the antenna layer (103) comprises a metallic patch, also having a square geometry. In preferred embodiments, the backing ground plane (109) is electrically coupled to the lower embedded metallic layer (107) via a plurality of vias (111).

In other embodiments, a distance, h1, separates the antenna layer (103) and the upper embedded metallic layer (105). A distance, h1, may separate the upper and lower embedded metallic layers (105,107). In exemplary embodiments, h1 and h2 are selected to obtain mode-free bandgap behavior at the selected bandgap frequency. A distance, h3, may separate the lower embedded metallic layer (107) and the backing ground plane (109). In preferred embodiments, h1 is selected to ensure that the antenna layer (103) is electrically uncoupled or disconnected from the upper and lower embedded metallic layers (105,107); thereby eliminating a degradation of radiation properties of the metallic patch.

In further embodiments, the upper embedded metallic layer (105) comprises a first set of concentric metallic rings and the lower embedded metallic layer (107) comprises a second set of concentric metallic rings. Each ring in the first and second sets of concentric metallic rings may have one or more gaps, of a given width w0, disposed thereon. These gaps have been found to be effective for optimizing the radiation frequency response of the bandgap-antenna structure (100). In some embodiments, each gap is positioned to allow each ring to be rotationally symmetric with all other rings.

In additional embodiments, an excitation probe feeds the metallic patch energy within a given antenna frequency region. The metallic patch may radiate the energy in a direction perpendicular to the bandgap-antenna structure (100). In exemplary embodiments, the given antenna frequency region and the bandgap frequency region overlap so that the mode-free omnidirectional bandgap behavior is exhibited during said energy radiation by said antenna layer (103).

In supplementary embodiments, a bandgap-antenna array comprising two or more of the previously described bandgap-antenna structures is capable of operating as an antenna integrating said mode-free omnidirectional bandgap behavior.

The present invention additionally features a method for constructing a bandgap-antenna structure (100) configured to operate as an antenna element integrating mode-free omnidirectional bandgap behavior. In some embodiments, the method comprises operatively coupling an antenna layer (103), comprising a metallic patch having a square geometry, to a top surface of a substrate. In an embodiment, the substrate (101) is a solid cube having a height, D, close to half-wavelength of a phased array frequency that lies within a bandgap frequency region. An upper embedded metallic layer (105) may be placed within the substrate a distance h1 below the antenna layer. In another embodiment, the upper embedded metallic layer (105) comprises a first set of concentric metallic rings. A lower embedded metallic layer (107) may be placed within the substrate a distance h2 below the upper embedded metallic layer (105). In one embodiment, the lower and upper metallic layers (105,107) are electrically coupled. In still another embodiment, the lower embedded metallic layer (107) comprises a second set of concentric metallic rings.

In additional embodiments, a backing ground plane (109) is operatively coupled to a bottom surface of the substrate at a distance h3 from a bottom surface of the lower embedded metallic layer (107). In some embodiments, the backing ground plane (109) is electrically coupled to the lower embedded metallic layer (107) via a plurality of vias (111). In other embodiments, the antenna layer (103), the upper and lower embedded metallic layers (105,107), and the backing ground plane (109) are aligned such that a center of each is disposed along an axis normal to the substrate (101).

In supplementary embodiments, the metallic patch is fed with energy, within a given antenna frequency region, via an excitation probe. This may cause the metallic patch to radiate said energy in a direction perpendicular to the substrate (101). In exemplary embodiments, the given antenna frequency region and the bandgap frequency region overlap so that the mode-free omnidirectional bandgap behavior is exhibited during said energy radiation by said antenna layer (103).

In some embodiments, h1, h2, and h3 are selected to obtain mode-free bandgap behavior at the selected bandgap frequency. In other embodiments, h1 is selected to ensure that the antenna layer (103) is electrically uncoupled or disconnected from the upper and lower embedded metallic layers (105,107); thereby eliminating a degradation of radiation properties of the metallic patch.

Figure 1D:
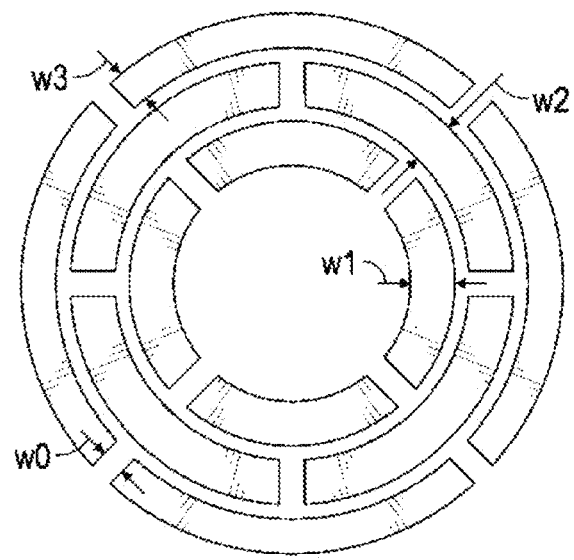
FIG. 1D shows a bottom view of the concentric rings.

As shown in FIG. 1D, in further embodiments, each ring in the first and second sets of concentric metallic rings has one or more gaps of a given width, w0. Each gap may be positioned to allow each ring to be rotationally symmetric with all other rings. As previously mentioned, the one or more gaps has been found to effectively optimize a radiation frequency response of the bandgap-antenna structure (100).

The present method may be used to construct a phased array, comprising one or more of the bandgap-antenna structures (100), for providing antenna elements that eliminate scan blindness along all directions as a result of the integrated mode-free omnidirectional bandgap behavior.

The present invention further features a method of generating mode-free omnidirectional bandgap behavior in an antenna element. In some embodiments, the method comprises operatively coupling an antenna layer (103), comprising a metallic patch having a square geometry, to a top surface of a substrate. In an embodiment, the substrate (101)

is a solid cube having a height, D, close to half-wavelength of a phased array frequency that lies within a bandgap frequency region. An upper embedded metallic layer (105) may be placed within the substrate a distance h1 below the antenna layer. In another embodiment, the upper embedded metallic layer (105) comprises a first set of concentric metallic rings. A lower embedded metallic layer (107) may be placed within the substrate a distance h2 below the upper embedded metallic layer (105). In one embodiment, the lower and upper metallic layers (105,107) are electrically coupled. In still another embodiment, the lower embedded metallic layer (107) comprises a second set of concentric metallic rings.

In additional embodiments, a backing ground plane (109) is operatively coupled to a bottom surface of the substrate at a distance h3 from a bottom surface of the lower embedded metallic layer (107). In some embodiments, the backing ground plane (109) is electrically coupled to the lower embedded metallic layer (107) via a plurality of vias (111). In other embodiments, the antenna layer (103), the upper and lower embedded metallic layers (105,107), and the backing ground plane (109) are aligned such that a center of each is disposed along an axis normal to the substrate (101).

In supplementary embodiments, the metallic patch is fed with energy, within a given antenna frequency region, via an excitation probe. This may cause the metallic patch to radiate said energy in a direction perpendicular to the substrate (101). In exemplary embodiments, the given antenna frequency region and the bandgap frequency region overlap so that the mode-free omnidirectional bandgap behavior is exhibited during said energy radiation by said antenna layer (103).

In some embodiments, h1, h2, and h3 are selected to obtain mode-free bandgap behavior at the selected bandgap frequency. In other embodiments, h1 is selected to ensure that the antenna layer (103) is electrically uncoupled or disconnected from the upper and lower embedded metallic layers (105,107); thereby eliminating a degradation of radiation properties of the metallic patch.

As shown in FIG. 1D, in further embodiments, each ring in the first and second sets of concentric metallic rings has one or more gaps of a given width, w0. Each gap may be positioned to allow each ring to be rotationally symmetric with all other rings. As previously mentioned, the one or more gaps has been found to effectively optimize a radiation frequency response of the antenna element.

The present method may be used to construct a phased array, comprising one or more antenna elements, which eliminate scan blindness along all directions as a result of the mode-free omnidirectional bandgap behavior.

In some embodiments of the present structures and methods, each corresponding ring in the first and second sets of concentric metallic rings has a given width. For example, an embodiment discloses the first and second sets of concentric metallic rings each having three rings disposed concentrically (see FIGS. 1C and 1D). A width of each inner ring, of the first and second set, may be equal to w1; a width of each middle ring may be w2; and a width of each outer ring may be w3. In alternate embodiments, the sizes of w1, w2, and w3 may or may not be equal.

In other embodiments of the present structures and methods, each corresponding ring in the first and second sets of concentric metallic rings is disposed within a given distance from the common center of said sets of rings. For example, an embodiment discloses the first and second sets of concentric metallic rings each having three rings disposed concentrically (see FIGS. 1C and 1D). A radius of each inner ring, of the first and second set, from the common center may be equal to r1; a radius of each middle ring from the common center may be r2; and a radius of each outer ring from the common center may be r3.

In further embodiments of the present structures and methods, a width, d, of each vias, of the plurality of vias, is chosen to obtain the bandgap behavior at a prescribed frequency region. Additionally, ring widths, spacing between rings, and ring radii are chosen to obtain the bandgap behavior at the prescribed frequency region and to obtain bandgap behavior along all directions. In exemplary embodiments, said frequency region is about 2.90-3.00 GHz. Moreover, ring shapes and the placement of the plurality of vias are selected to obtain the omnidirectional bandgap behavior.

Experimental Details

FIGS. 1A-1D show the bandgap-antenna structure of the present invention, which is capable of forbidding both bound and radiating modes propagating laterally along all directions within the substrate. The top metallic patch functions as a radiator, while the two layers of embedded rings are employed to introduce the bandgap behavior as they are considered together with the top patch as one structure. When used as an array element, the presented structure is unique because it eliminates substrate waves from producing coupling between array components. Another important feature of this structure is that there is no metallization pattern, other than patches serving as radiators, on the antenna layer. All other metallization is embedded underneath the antenna layer. In contrast, conventional integrated EBG and phased array structures have both radiating and bandgap metallization on the same layer [18-20]. The bandgap is obtained from the whole structure, including antenna and embedded metallic layers. The size of the unit element structure is close to the free space half-wavelength at the bandgap frequency. A microstrip patch antenna element on a uniform substrate, without any other metallization within the substrate was used as a reference to demonstrate the performance of the bandgap-antenna structure. This uniform patch antenna is also square and resonates at the same frequency as the bandgap-antenna structure, within an infinite array environment.

Figure 2:
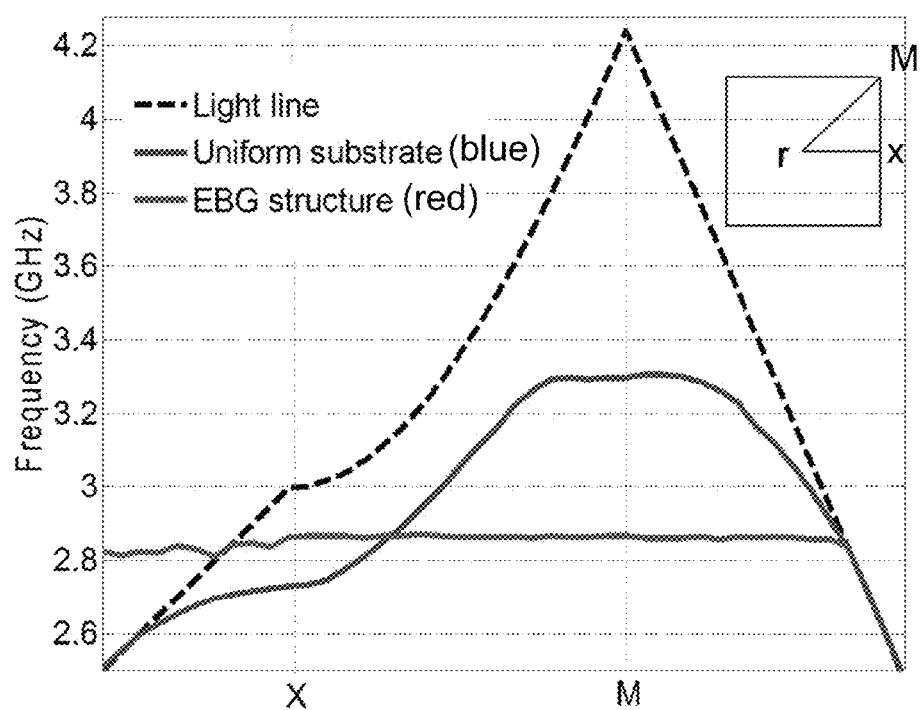
FIG. 2 shows an omnidirectional dispersion diagram of the bandgap-antenna and uniform substrate elements.

FIG. 2 shows an omnidirectional dispersion diagram for the bandgap-antenna structure and a reference antenna element on a uniform substrate. While the reference antenna supports a propagating mode within the frequency band of interest (2.90-3.00 GHz), the bandgap-antenna structure does not support any mode within this frequency band. If both of these elements are used to design phased arrays, an array employing the reference antenna element will induce coupling and eventually scan blindness due to the propagating mode shown in the dispersion diagram. An array comprising the bandgap-antenna structure will not show any coupling or scan blindness. Note that this dispersion diagram is obtained using full-wave eigenmodes along all lateral directions. However, this technique is only capable for element sizes of $0.5\lambda_0$ or smaller at the highest bandgap frequency, and also it is not stable for radiating or leaky wave modes. The role of any radiating modes can be further explained via model field profiles or transmission techniques.

Figure 3:
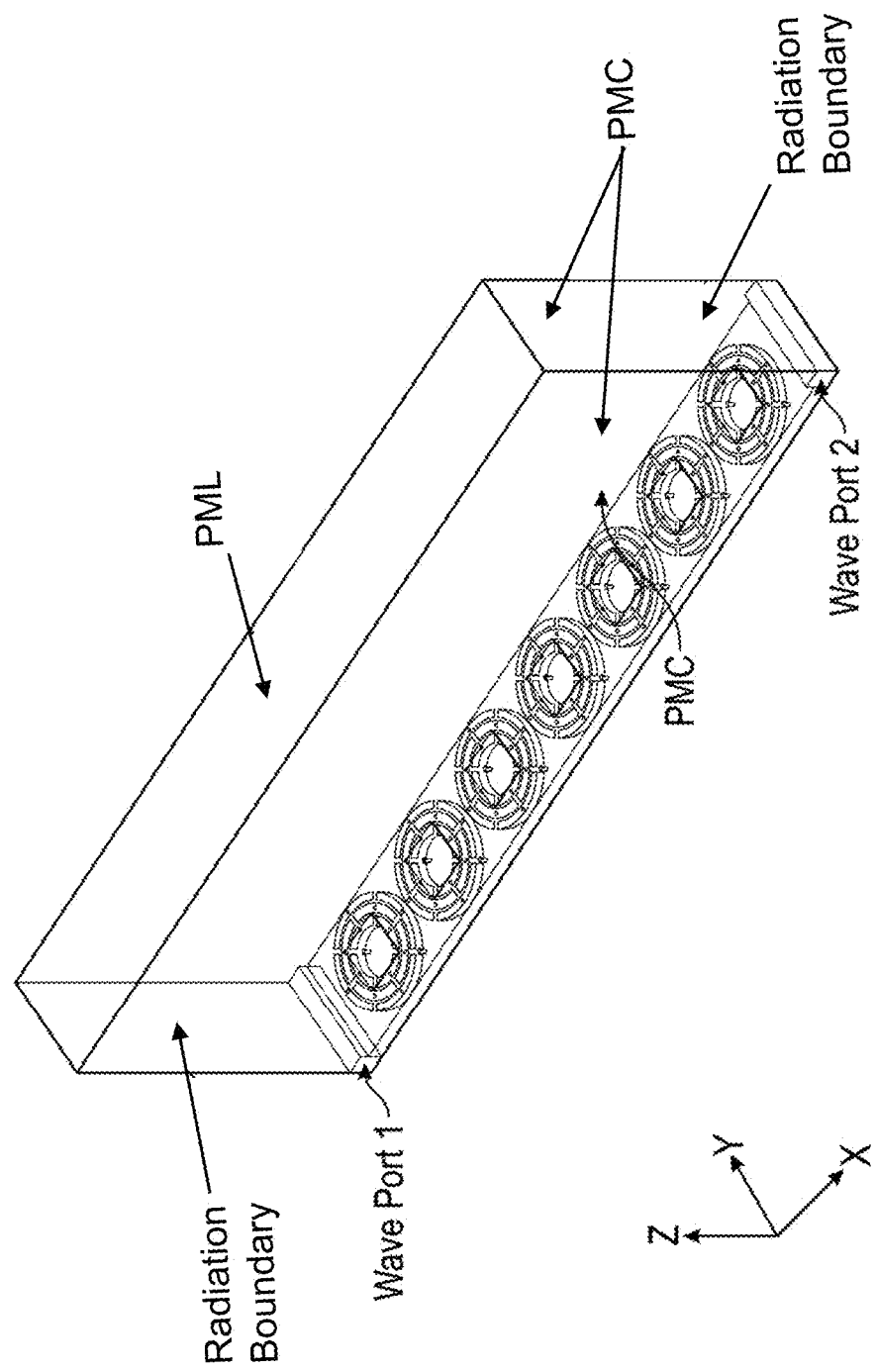
FIG. 3 shows a two-port transmission setup.

FIG. 3 shows the setup of the transmission technique, which was used to further demonstrate the bandgap properties of the bandgap-antenna structure. More specifically, the transmission setup was used to make sure that any potential radiating modes will not affect the obtained bandgap properties using the eigenmode technique. The transmission setup also served as a reference for arrays with larger element spacing. The disadvantage of this setup is that only one direction of propagation can be studied. Also, for the same propagation direction, transmission and eigenmode techniques are not identical since the transmission technique considers all modes along a given direction, as well as wave components of the modes along remaining directions. The eigenmode considers only the modes propagating along a given direction, not the components of the modes propagating along remaining directions.

FIG. 4 shows that the frequency bandgap (−10 dB transmission with respect to uniform structure transmission) obtained from the transmission technique setup was consistent with the bandgap obtained via the eigenmode technique. FIGS. 5A-5B show the bandgap-antenna structure with a stripline impedance matching network. The stripline impedance matching network was chosen since the stripline configuration does not allow coupling within the matching network, thus fully utilizing the bandgap behavior. Note that the matching network was isolated from the original bandgap-antenna structure, therefore, it does not affect the bandgap behavior of the bandgap-antenna structure. The single element operation frequency was chosen to be 2.99 GHz, which is within the bandgap frequency range of 2.95-3.02 GHz. Preferably, this working frequency should be very close to half-wavelength (at 3.00 GHz) for scanning investigations to focus on scan blindness. If the substrate size or inter-element spacing is reduced too much, or if the operating frequency was chosen much lower than 3.00 GHz, scan blindness will disappear from the uniform substrate array and performance of the bandgap structure cannot be evaluated.

Figure 6:
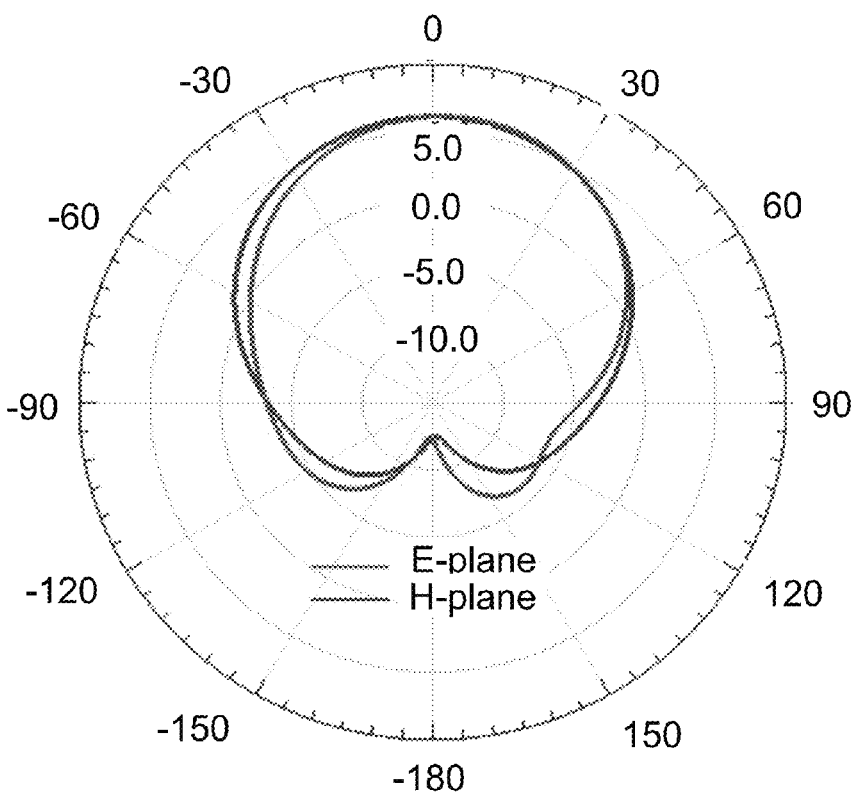
FIG. 6 shows the realized gain (dBi) pattern of the radiating-bandgap structure with coax-fed stripline matching network.
Figure 7A:
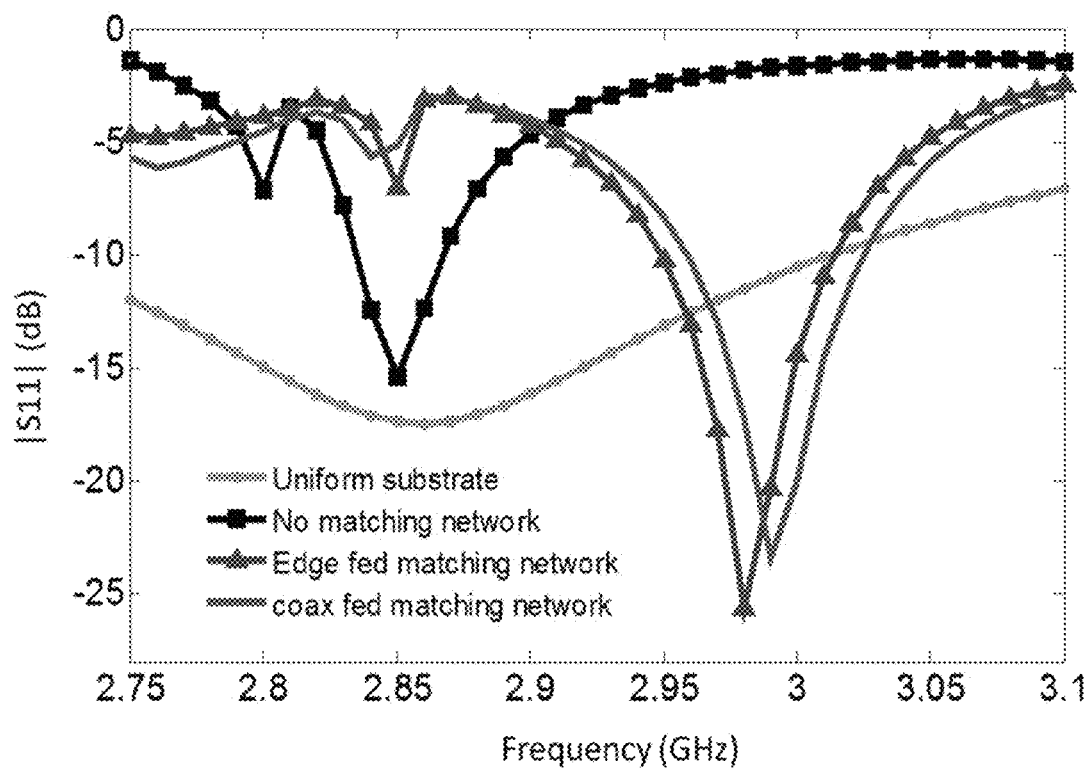
FIG. 7A shows the input reflection coefficient for a uniform substrate conventional patch antenna and a radiating-bandgap structure with: no matching network, an edge-fed stripline matching network, and a coax-fed stripline matching network.
Figure 7B:
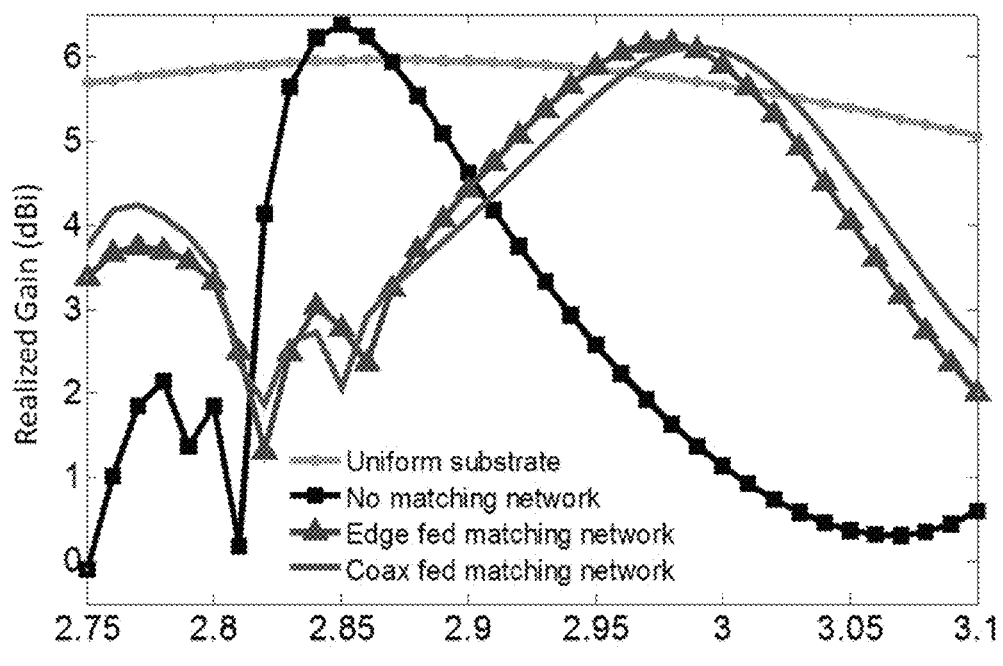
FIG. 7B shows the realized gain for a uniform substrate conventional patch antenna and a radiating-bandgap structure with: no matching network, an edge-fed stripline matching network, and a coax-fed stripline matching network.

FIG. 6 shows that the radiation behavior of the stripline impedance matched bandgap-antenna structure was similar to the conventional patch antenna, as it radiates to the broadside direction with a realized gain of 6.12 dBi. FIGS. 7A-7B show radiation characteristics of different impedance matching conditions. The bandgap structure without the stripline impedance matching network resonates as a radiator at 2.85 GHz, far away from the desired working frequency 2.99 GHz. In order to design a proper impedance matching network, the structure's input impedance was obtained at the feed position, where the probe connects to the top patch. For that, the stripline was first fed, without any matching stub, from the edge. Then, the input impedance was obtained by de-embedding the port 32 mm from the excitation point to the feed position to obtain 226+j246 Ω at 3.00 GHz. In order to match this load impedance to the 50 Ω port impedance, a 3.2 mm long shorting stub, positioned 11.4 mm away from the load, was introduced into the stripline. The input impedance of the structure, with the edge-fed stripline impedance matching network, was then obtained as 59+j5 Ω at 3.00 GHz. Since feeding the structure from the edge is not practical in array configurations, the excitation was modified by introducing a coax to the stripline transition without changing the already designed matching network. This was to allow the structure to be excited using conventional techniques, such as a subminiature version A ("SMA") connector. The completed bandgap-antenna element with proper excitation and matching network is shown in FIGS. 5A-5B. Both edge-fed and coax-fed excitation provides similar input reflection coefficients and realized gain, when the element is an efficient radiator within the bandgap frequency. However, the original bandgap-antenna structure, without the matching network, radiated outside the bandgap. The uniform substrate patch antenna element, used as a reference, had a smaller gain and a broader bandwidth.

Note that the uniform substrate and the impedance matched bandgap-antenna structure radiate at different frequencies, since the objective was to have them radiate at the same frequency when used in larger arrays. The array radiation frequency was close to the impedance matched bandgap-antenna element.

In order to present achievement of the bandgap-antenna structure, the problem with uniform substrate phased arrays is described here. There are two distinct types of modes related to microstrip phased arrays. Radiation from the arrays can be considered as an infinite number of Floquet modes. Practically, only the first few of these modes, representing array radiation, couple to air as radiation. The remaining modes are evanescent, i.e., they decay exponentially in the air medium above the array structure while carrying energy and propagating on the array surface. The scanned main beam in phased arrays is due to the fundamental Floquet mode, while well known grating beams are of higher order Floquet modes propagating in the air medium. The second type of mode supported by the array structure are guided modes, which propagate within array substrates. These modes can be either completely bound to the array structure, without coupling to the surrounding air medium, or they can couple to the air medium by radiation. These modes are known as surface wave (bounded) and leaky wave (radiating) modes. Coupling of these two distinct sets of modes has a significant impact on the array structure.

In general, excitation of these guided modes require certain feeding mechanisms. However, electric currents on the array elements, whose main task is to form the radiation, may excite surface and leaky waves modes along a specific direction as the array elements are excited. These modes will propagate in the array structure similar to the modes propagating in a waveguide.

Figure 8A:
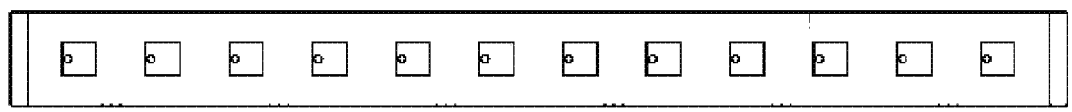
FIG. 8A shows a top view, E-plane, of a transmission setup for demonstration of the substrate wave modes excitation on a uniform substrate conventional patch antenna array.
Figure 8B:
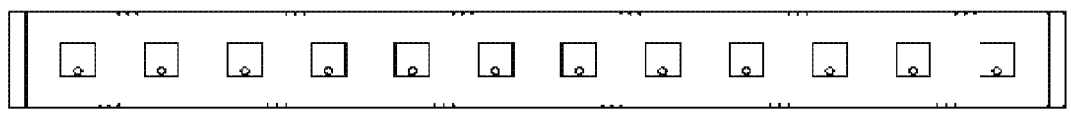
FIG. 8B shows a top view, H-plane, of a transmission setup for demonstration of the substrate wave modes excitation on a uniform substrate conventional patch antenna array.
Figure 8C:
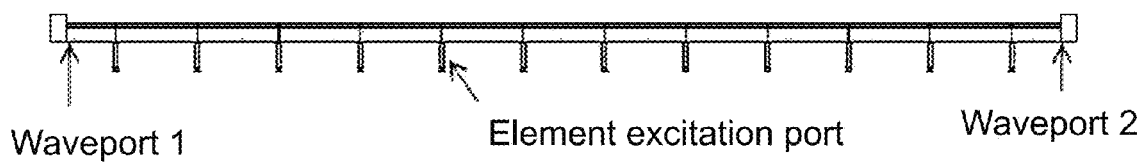
FIG. 8C shows a side view of a transmission setup for demonstration of the substrate wave modes excitation on a uniform substrate conventional patch antenna array.
Figure 9A:
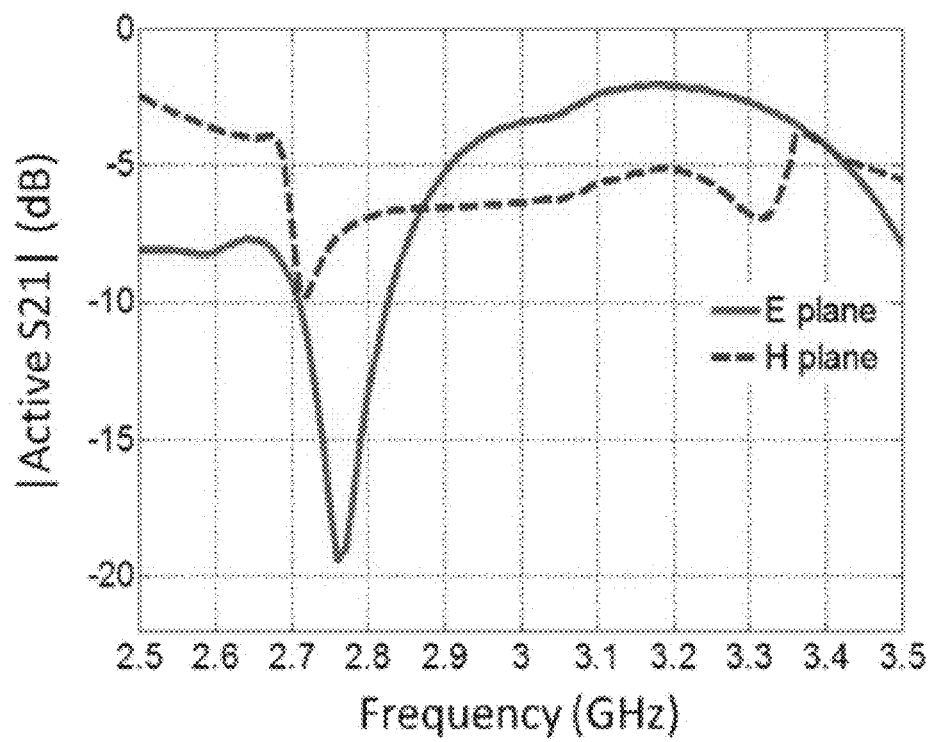
FIG. 9A shows the transmission through a substrate when all uniform substrate elements are terminated with 50 Ω loads.
Figure 9B:
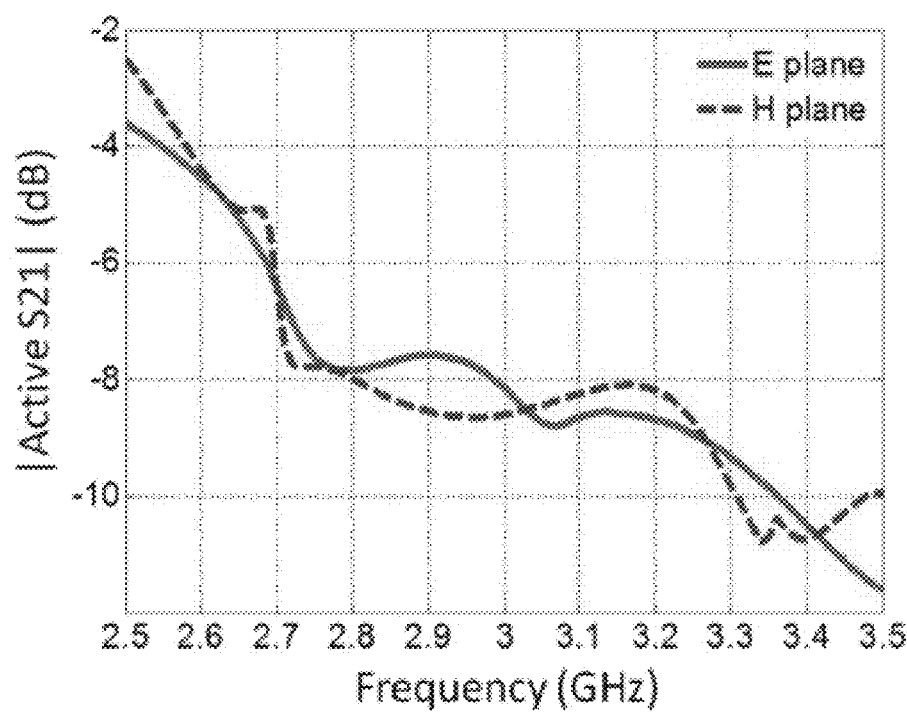
FIG. 9B shows the transmission through a substrate when all uniform substrate elements are excited and phased for broadside radiation.
Figure 9C:
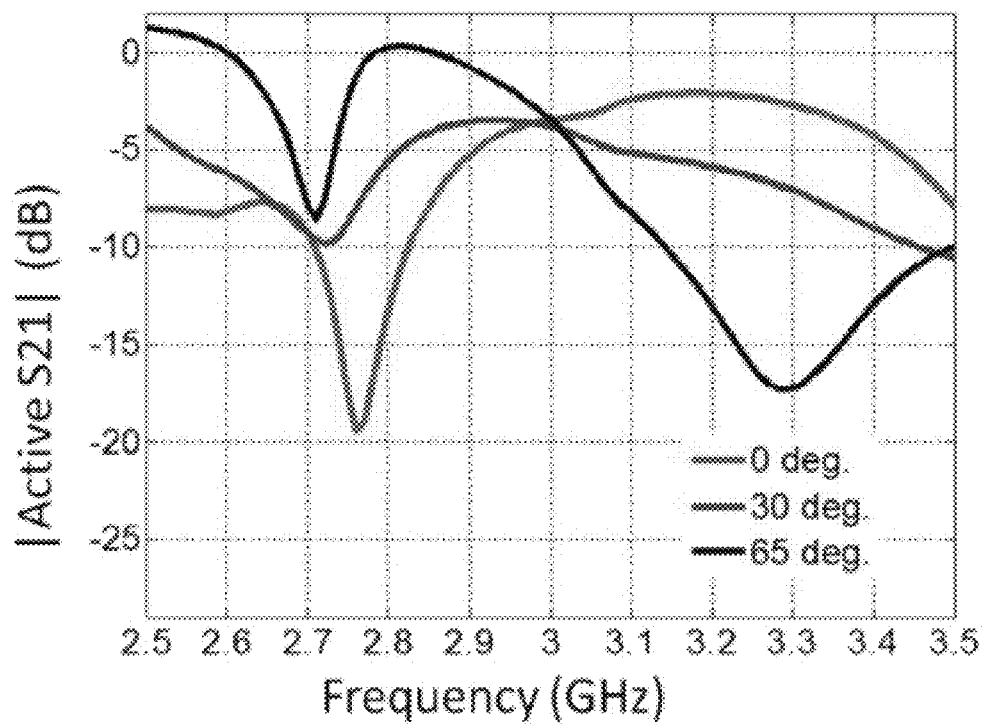
FIG. 9C shows the transmission through a substrate when all uniform substrate elements are excited and phased for different scan directions for elements placed along the E-plane.

FIGS. 8A-8C demonstrate excitation of surface and leaky waves in a uniform substrate phased array structure. Each element in the array is excited. There are two additional ports at the edges of each array to detect the waves propagating within the substrate, such as surface and leaky waves. Different cases are compared for E-scan and H-scan planes in FIGS. 9A-9D. Note that these results are for a semi-infinite array, that is, only 12 elements are used along the direction of propagation; an infinite number of elements are used along the other direction. In addition, analyses were performed within −10 dB bandwidth of the radiating structure, where it is from 2.70 to 3.01 GHz for an isolated uniform substrate single element, and from 2.80 to 3.11 GHz for the same element in the planar infinite array. Therefore, frequency regions between these two bands were considered when analyzing the semi-infinite structure in FIGS. 9A-9D. By comparing FIGS. 9A and 9B, it can be seen that substrate waves were effective even for broadside radiation. Excitation of array elements excite these substrate modes, which then propagate in the substrate. Since array currents were polarized along the E-scan plane, substrate modes were dominant along the E-plane as shown in FIG. 9A. On the other hand, when elements were not excited, propagation within the substrate was similar along the E-scan and H-scan planes as shown in FIG. 9B. However, a greater accuracy to the present discussion is for scan angles corresponding to the phase matching condition between substrate waves and array modes, where excitation of substrate modes is the most significant. As shown in FIG. 9C, propagation in the substrate peaks at these scan angles. Scan blindness occurred for the analyzed array at 65° scan angle along the E-plane. The transmission results of FIG. 9C agreed well with this angle.

Figure 9D:
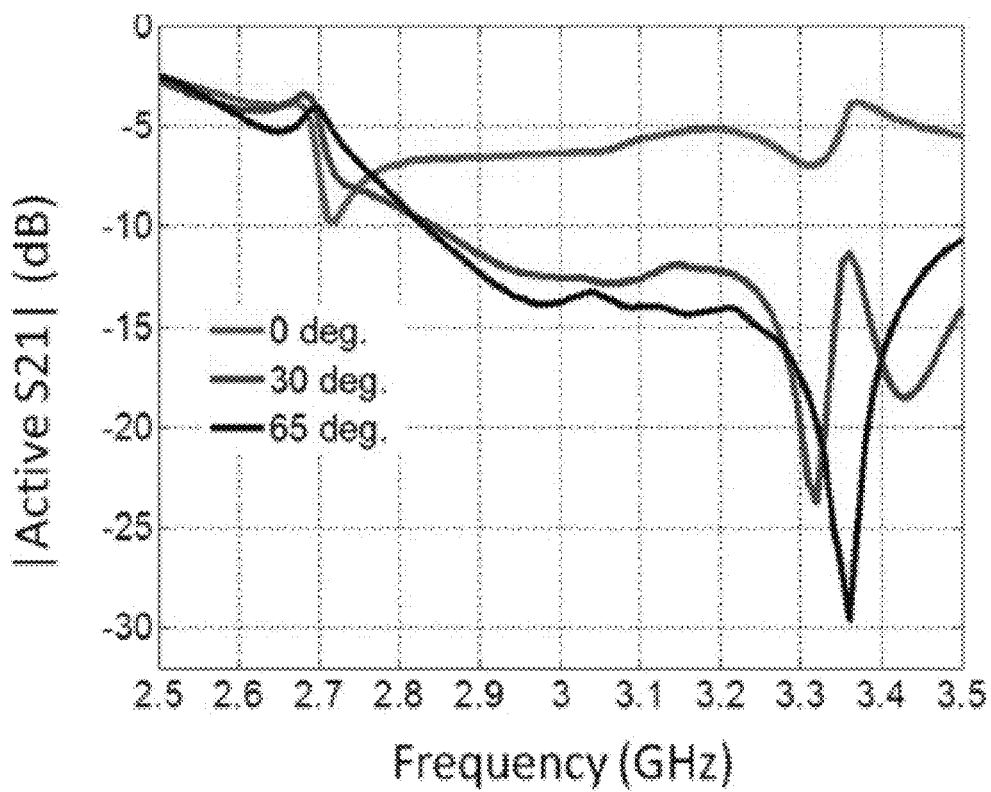
FIG. 9D shows the transmission through a substrate when all uniform substrate elements are excited and phased for different scan directions for elements placed along the H-plane.

On the other hand, this was not true, as expected, for the H-plane of FIG. 9D, where excitation of substrate modes was not achieved due to array element current polarizations to along the E-plane.

Two different sets of modes were presented for phased arrays; one represented the array field and the other represented the substrate mode field. It is possible that the Floquet modes from these two different sets coupled to each other. If that is the case, then excitation of the substrate modes peaked and a significant portion, or all of the array energy, coupled to these modes. Further, these modes remained in the substrate instead of being radiated into the air. This happened when the tangential phase constant of a radiation Floquet mode $k_{pq}$ is equivalent to that of a substrate mode $\beta_{sub}$. This coherent coupling, or scan blindness condition, can also be written as $$\beta_{sub}^2 = \left(\frac{2\pi p}{d_x} + k_0 \sin\theta \cos\varphi\right)^2 + \left(\frac{2\pi q}{d_y} + k_0 \sin\theta \sin\varphi\right)^2. \quad (1)$$

where $\beta_{sub}$ can be $\beta_{sw}$ or $\beta_{lw}$, depending on the mode type under consideration. Eq. (1) is not a sufficient condition for scan blindness to occur. Current, with proper polarization, available on the array structure is also needed to excite substrate wave modes.

The scan blindness phase matching condition of Eq. (1) cannot be satisfied between bounded surface wave modes whose phase constant $\beta_{sw}$ is larger than that of free space $k_0$ and the (0,0) Floquet mode or main beam. In most practical cases, scan blindness is due to coupling between a surface wave mode and the (±1,0) Floquet modes. However, it can also be seen from Eq. (1), for the first time, that scan blindness due to the (0,0) Floquet mode or main beam is possible if the array excites leaky wave modes having a phase constant $\beta_{lw}$ smaller than that of free space $k_0$. This condition has never been considered in open literature. However, its impact is important for modern integrated structures using composite substrates, where the potential of leaky waves is greater.

The bandgap-antenna structure can eliminate scan blindness along all scan directions due to its omnidirectional, mode-free bandgap behavior. Omnidirectional bandgap is essential for planar arrays. Otherwise coupling, and hence scan blindness, would occur along some directions. Square shaped patch, rotational symmetric rings, and via configurations make omnidirectional bandgap possible with the proposed bandgap antenna structure of the present disclosure.

Figure 10:
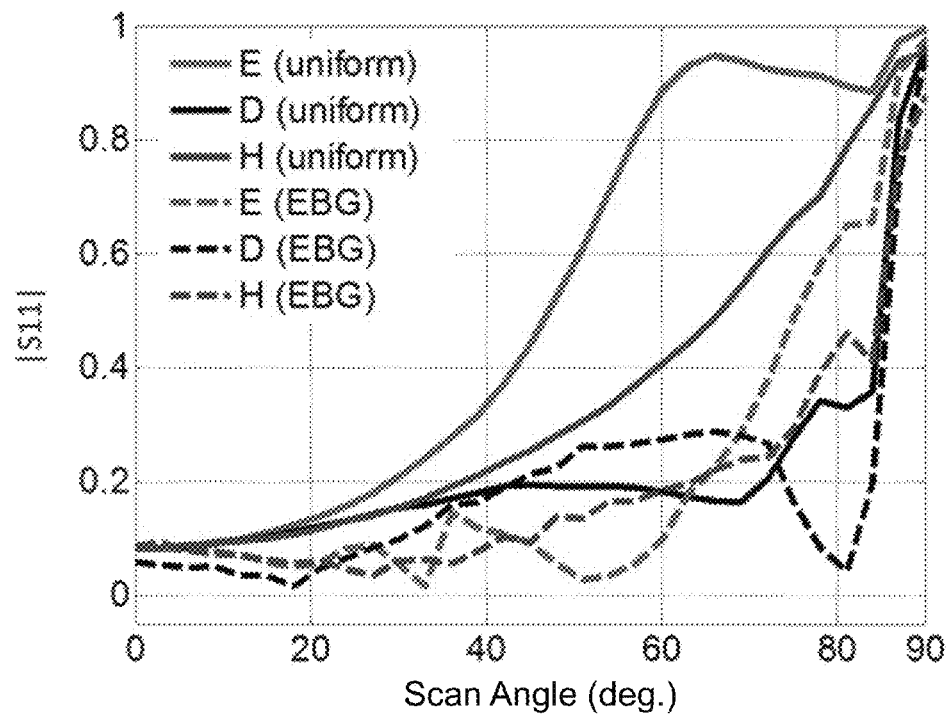
FIG. 10 shows the scan behavior of the uniform substrate and bandgap-antenna array for different scan planes, where the frequency is 2.96 GHz, the element spacing is 50 mm or $0.4933\lambda_o$, and the substrate thickness is 6.985 mm or $0.0689\lambda_o$.

FIG. 10 shows the effect of bandgap behavior on array scan blindness elimination, where scan behavior of uniform and the proposed bandgap-antenna structure are compared. The performance of the bandgap structure is obvious, scan blindness is completely eliminated from all scan planes. The most significant improvement is seen in the E-scan plane where the reflection coefficient is reduced from 0.946 to 0.181 at a scan angle of 65°, which coincides with the uniform array scan blindness angle. For all three scan planes, the reflection coefficient remains below 0.3 or −10 dB up to 70°. A slight increment in the D-plane was likely due to coupling between metallic parts of the unit element. The size of the square substrate and substrate thickness were 50 mm (0.4933$\lambda_0$) and 6.985 mm (0.689$\lambda_0$), respectively. Where $\lambda_0$ is the wavelength of the array at the operating frequency of 2.96 GHz.

Figure 11:
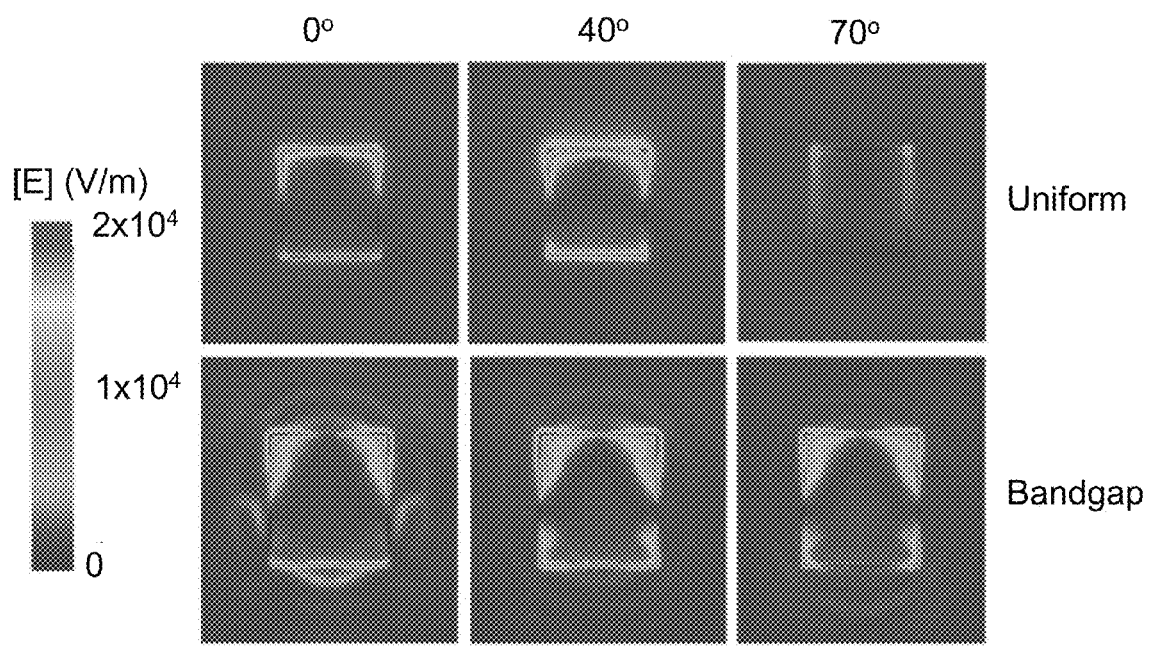
FIG. 11 shows the electric field distribution on substrate surfaces of uniform substrate and bandgap-antenna arrays for different scan angles: 0°, 40°, and 70° from left to right in the E-plane.

FIG. 11 shows the effect of scan blindness on array radiation. It also shows how the bandgap-antenna structure improves array characteristics by eliminating scan blindness, where electric field magnitudes on the substrate surface were compared. Radiation from the uniform substrate array vanishes near the blind angle at 70°. Excited power into the array coupled to the excited substrate modes and remained in the substrate instead radiating. A very weak electric field magnitude at this angle is a result of the behavior of the excitation port as a terminator, such that strongly excited substrate modes return energy back to the port instead of trapping them within the substrate. If there were no port termination, the electric field would be very strong at this angle. However, the situation is different for the bandgap-antenna array. Since there is no substrate waves to be excited, the electric field magnitude remains almost the same for all scan angles shown.

The bandgap-antenna structure was composed of four metallic layers. Coupling between these layers, along the direction normal to the structure surface, tremendously affects the performance of the structure. Since the structure has been co-designed for bandgap and radiation purposes, internal coupling effects may be different on the bandgap and radiation properties. Several different configurations were investigated, which provided even better bandgap performance than the structure studied previously. However, all of those structures failed when considered for radiation and scanning analyses. Another degree of internal couplings, which can be more severe and unpredictable as the first, results from changing the element excitation phase in order to scan the beam. This phase change introduces unpredictable couplings that vary with scan angles. Therefore, consideration of the effect of internal couplings is a key step in the design of the bandgap-antenna structure. On the other hand, internal coupling effects may not be that effective for broadside arrays, since there is no phase change. Thus, the design methodology presented here can be easily applied to broadside arrays for mutual coupling reduction, especially for highly integrated or compact arrays. Note that bandgap behavior does not change with excitation phase, while internal couplings between different metallic layers does. In addition, since these internal couplings are along the direction normal to the array structure, they cannot be investigated using modal analysis techniques, i.e., eigenmode and transmission methods, because these methods consider propagation along the lateral directions only. The overall effect of these internal couplings induces scan blindness-like peaks in the reflection coefficient at even closer angles to the broadside direction, with respect to the scan blindness angle of the array on a uniform substrate with the same substrate material and size.

In order to analyze scan and radiation behaviors of finite arrays, an array configuration with a minimum number of elements is desired, since both simulation and fabrication of the prototype arrays are expensive. The uniform substrate array configuration should be determined to provide for a number of array elements sufficient to detect scan blindness. Another important aspect of finite arrays is feeding networks for beam scanning, which contains phase shifters and power dividers. However, it is still possible to characterize array scan and radiation behaviors without using feeding networks (e.g., using an active element pattern ("AEP") and an active reflection coefficient [37-38], for pattern and reflection coefficients of the center element when the center element is excited and all the other array elements are terminated with a 50 Ω load). However, the present objective is to analyze scan blindness with a minimum number of array elements without using phasing network mechanisms.

Figure 12:
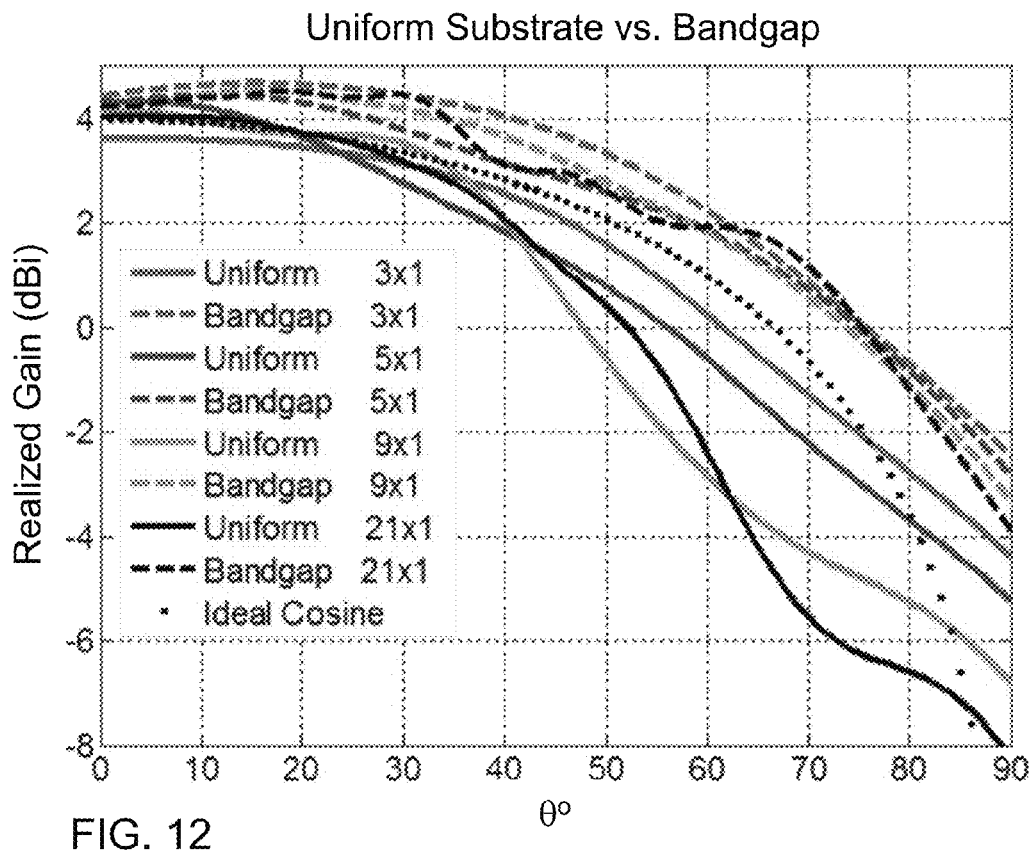
FIG. 12 shows the E-plane active element pattern for different sized arrays of uniform substrate and bandgap-antenna arrays.

FIG. 12 shows an AEP of the center elements for different size linear uniforms and bandgap arrays when all other elements are terminated with a 50 Ω load. The scan blindness effect becomes more dominant with an increase in array size. More importantly, linear arrays of the bandgap structure demonstrate successful elimination of scan blindness regardless of array size. AEP patterns of different size bandgap structures were about the same and improved scan behavior substantially compared to the uniform array configurations.

In addition to the radiation consideration of finite sized arrays, such as the AEP of FIG. 12, scan blindness can also be analyzed using the input reflection coefficients of array elements while the array is fully excited. This case is similar to the infinite array scan blindness investigation, where array scan blindness was characterized using the input reflection coefficient of the center element while all array elements were excited. However, different from the AEP approach, input reflection based scan blindness analysis of finite sized arrays requires a large number of elements to detect scan blindness and is thus impractical to implement.

Figure 13:
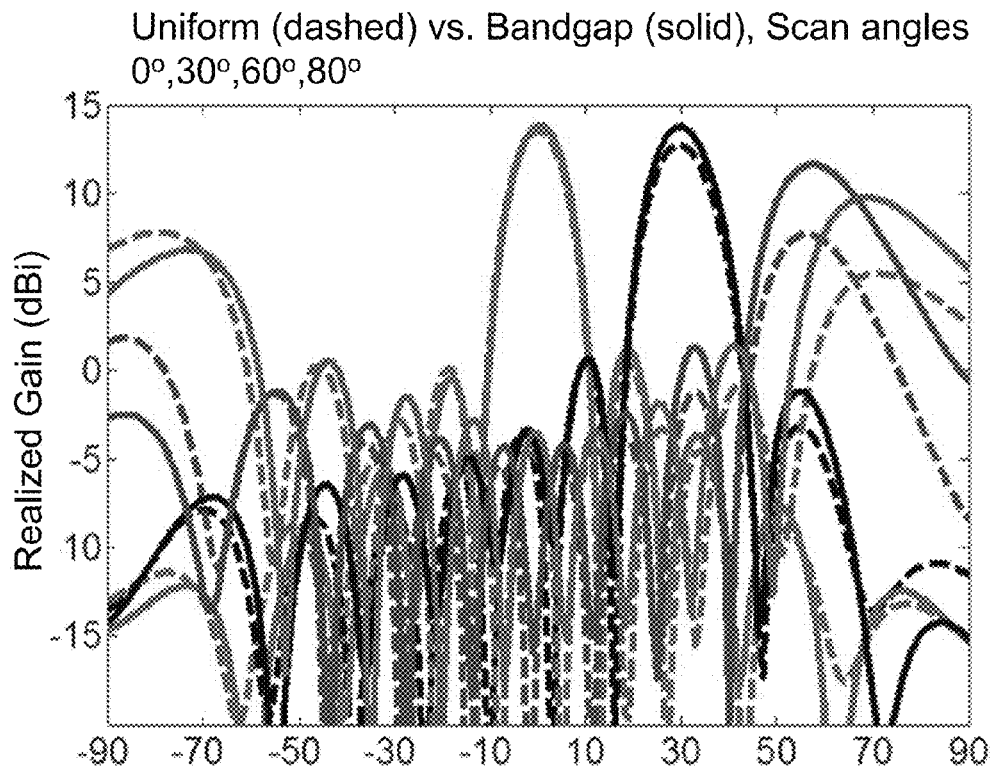
FIG. 13 shows the fully-excited E-plane scan patterns of linear nine elements uniform substrate and bandgap-antenna arrays.

FIG. 13 compares the co-polarized scan patterns of the E-plane nine linear elements of the uniform substrate and the bandgap-antenna array at different scan angles. This figure illustrates the radiation performance of the bandgap-antenna elements on a fully-excited array. While their patterns are overlapped at the broadside scan, the effects of scan blindness become clear after the 60° scan angle. Indeed, scan blindness remains effective from around 60° to 90°. In particular, peak gain differences between these two arrays were 3.9 dBi and 4.3 dBi for the beams forced to point to the 60° and 80° scan angle directions. This difference becomes larger, and performance of the bandgap array will become more appreciable, as the number of elements are increased. It is also important to notice that patterns of both array configurations are similar, thus, the bandgap array can replace conventional microstrip arrays without alterations on the beam qualities of the original array.

Figure 14:
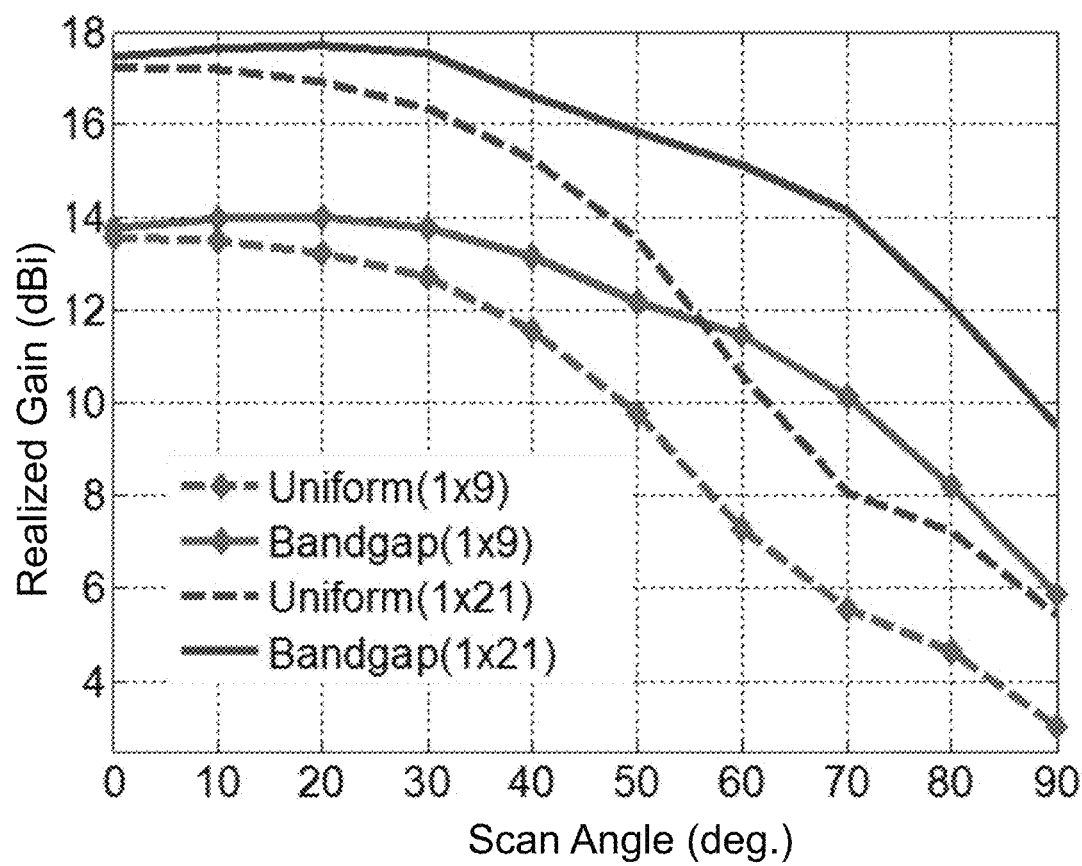
FIG. 14 shows the realized gain versus scan angle for 1×21 and 1×9 linear arrays.

FIG. 14 shows peak gains at different scan directions from broadside to endfire for E-plane 9 and 21 elements linear uniform substrate and bandgap arrays. At the broadside direction, both arrays provide very close gain values: 13.55 versus 13.78 dBi for 9 elements uniform substrate and bandgap arrays, and 17.24 versus 17.46 dBi for 21 elements uniform and bandgap arrays. However, as the arrays are scanned, the gain of the uniform arrays decrease significantly and deviates from ideal scan values. The deviation from the ideal values is more significant around the scan blindness angles (between 60° and 70°). On the other hand, the gain of the bandgap array remains higher than ideal scan values for all scan directions. Both the 9 and 21 element arrays demonstrate bandgap effects, however, the effect is more dominant in the 21 element array. In particular, the gain differences between the bandgap array and the uniform array are 4 dBi and 6 dBi at a scan angle of 70° for 9 and 21 elements arrays, respectively. For larger linear or planar arrays this difference becomes larger, where the actual role of the bandgap array shows up.

The method used to design the bandgap-antenna structure, i.e., co-designing of a bandgap and antenna structure, can be applied to various microwave structures. For example, the present method may be used to design novel structures that cancel coupling from broadside arrays. It may also be used to implement very compact arrays having various applications, for example: 5G, 60 GHz, millimeter waves, massive MIMO, etc., and microwave filters. Co-designing these applications with electromagnetic bandgap structures of the present invention provides improved results and eliminates integration of two separate designs.

While not wishing to limit the present invention to any singular theory or mechanism, the following table provides nonlimiting example values for the elements comprising the bandgap-antenna structure of the present invention. As can be seen in Table 1 below, h1 may be about 1.27 mm, h2 may be about 3.175 mm, h3 may be about 2.54 mm, w1 and w2 may each be about 3.8 mm, and w3 may be about 3 mm.

TABLE 1

| Parameter Values | |
|---|---|
| Parameter | Value |
| D | 50 mm |
| L | 23 mm |
| h1 | 1.27 mm |
| h2 | 3.175 mm |
| h3 | 2.54 mm |
| h | 6.985 mm |
| d | 0.8 mm |
| w0 | 2 mm |
| w1 | 3.8 mm |
| w2 | 3.8 mm |
| w3 | 3 mm |
| d | 0.8 mm |
| r1 | 10 mm |
| r2 | 15 mm |
| r3 | 20 mm |

As used herein, the term "about" refers to plus or minus 10% of the referenced number.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met.

The reference numbers recited in the below claims are solely for ease of examination of this patent application, and are exemplary, and are not intended in any way to limit the scope of the claims to the particular features having the corresponding reference numbers in the drawings.

REFERENCES

[1] D. M. Pozar and D. H. Schaubert, "Scan blindness in infinite phased arrays of printed dipoles," IEEE Trans. Antennas Propagat., vol. 32, pp. 602-610, June 1984.

[2] D. M. Pozar and D. H. Schaubert, "Analysis of an infinite array of rectangular microstrip patches with idealized probe feeds," IEEE Trans. Antennas Propagat., vol. 32, pp. 1101-1107, October 1984.

[3] D. M. Pozar, "Analysis of finite phased arrays of printed dipoles," IEEE Trans. Antennas Propagat., vol. 33, pp. 1045-1053, October 1985.

[4] D. M. Pozar, "Finite phased arrays of rectangular microstrip patches," IEEE Trans. Antennas Propagat., vol. 34, pp. 658-665, May 1986.

[5] C.-C. Liu, A. Hassel, and J. Shmoys, "Performance of probe-fed microstrip-patch element phased arrays," IEEE Trans. Antennas Propagat., vol. 36, pp. 1501-1509, November 1988.

[6] V. B. Erturk, O. Bakir, R. G. Rojas, and B. Guner, "Scan blindness phenomenon in conformal finite phased arrays of printed dipoles," IEEE Trans. Antennas Propag., vol. 54, pp. 1699-1708, June 2006.

[7] D. M. Pozar, "Scanning characteristics of infinite arrays of printed antenna subarrays," IEEE Trans. Antennas Propagat., vol. 40, pp. 666-674, June 1992.

[8] R. B. Waterhouse, "Improving the scan performance of probe-fed microstrip patch arrays on high dielectric constant substrates," IEEE Trans. Antennas Propagat., vol. 43, pp. 705-712, July 1995.

[9] R. B. Waterhouse, "The use of shorting posts to improve the scanning range of probe-fed microstrip patch phased arrays," IEEE Trans. Antennas Propag., vol. 44, no. 3, pp. 302-309, March 1996.

[10] W. J. Tsay and D. M. Pozar, "Radiation and scattering from infinite periodic printed antennas with inhomogeneous media," IEEE Trans. Antennas Propagat., vol. 46, pp. 1641-1650, November 1998.

[11] R. L. Chen, D. R. Jackson, J. T. Williams, and S. A. Long "Scan impedance of RSW microstrip antennas in finite array," IEEE Trans. Antennas Propagat., vol. 53, pp. 1098-1104, March 2005.

[12] T. Crepin, J. P. Martinaud, T. Dousset, P. Rodriguez-Ulibarri, M. Beruete, C. Loecker, T. Bertuch, J. A. Marcotegui, and S. Maci, "Blind spot mitigation in phased array antenna using metamaterials," IEEE Int. Radar Conf., 2014.

[13] M. C. Tang, S. Xiao, B. Wang, J. Guan, and T. Deng, "Improved performance of a microstrip phased array using broadband and ultralow-loss metamaterial slabs," IEEE Antennas Propagat. Mag., vol. 53, pp. 31-41, December 2011.

[14] H. Moghadas, A. Tavakoh, and M. Salehi, "Elimination of scan blindness in microstrip scanning array antennas using defected ground structure," AEU-Int. J. Electron. Commun., vol. 62, pp. 155-158, 2008.

[15] D. B. Hou, S. Xiao, B. Z. Wang, L. Jiang, J. Wang, and W. Hong, "Elimination of scan blindness with compact defected ground structures in microstrip phased array," IET Microw. Antennas Propag., vol. 3, pp. 269-275, March 2009.

[16] M. H. Awida, A. H. Kamel, and A. E. Fathy, "Analysis and design of wide-scan angle wide-band phased arrays of substrate-integrated cavity backed patches," IEEE Trans. Antennas Propag., vol. 61, pp. 3034-3041, June 2013.

[17] P. K. Kelly, L. Diaz, M. Piket-May, and I. Rumsey, "Investigation of scan blindness mitigation using photonic bandgap structure in phased arrays," in Proc. SPIE, vol. 3464, July 1999, pp. 239-248.

[18] L. Zhang, J. A. Castaneda, and N. G. Alexopoulos, "Scan blindness free phased array design using PBG materials," IEEE Trans. Antennas Propagat., vol. 52, pp. 2000-2007, August 2004.

[19] Y. Fu and N. Yuan, "Elimination of scan blindness in phased array of microstrip patches using electromagnetic bandgap materials," IEEE Antennas Wireless Propag. Lett., vol. 3, pp. 63-65, 2004.

[20] Z. Iluz, R. Shavit, and R. Bauer, "Microstrip antenna phased array with electromagnetic bandgap substrate," IEEE Trans. Antennas Propagat., vol. 52, pp. 1446-1453, June 2004.

[21] G. Donzelli, F. Capolino, S. Boscolo, and M. Midrio, "Elimination of scan blindness in phased array antenna using a grounded-dielectric EBG material," IEEE Antennas Wireless Propag. Lett., vol. 6, pp. 106-109, 2007.

[22] M. S. M. Isa, R. J. Langley, S. Khamas, A. A. M. Isa, M. Zin, Z. Zakaria, N. Z. Haron, and A. Ahmad, "A technique of scan blindness elimination for planar phased array antenna using miniaturized EBG," Jurnal Teknologi, vol. 69, pp. 11-15, March 2014.

[23] J. E. Jerauld and D. C. Cook, "Electromagnetic Band Gap Structure for Enhanced Scanning Performance in Phased Array Apertures," U.S. Patent 2014/0028524 A1, published Jul. 26, 2012; issued Jan. 30, 2014.

[24] Y.-Y. Bai, S. Xiao, M.-C. Tang, Z.-F. Ding, and B.-Z. Wang, "Wide-angle scanning phased array with pattern reconfigurable elements," IEEE Trans. Antennas Propag., vol. 59, no. 11, pp. 4071-4076, November 2011.

[25] R. Wang, B.-Z. Wang, X. Ding, and X.-S. Yang, "Planar phased array with wide-angle scanning performance based on the image theory," IEEE Antennas Wireless Propagat., vol. 63, pp. 3908-3917, September 2015.

[26] S. E. Valavan, D. Tran, A. G. Yarovoy, and A. G. Roederer, "Dual-band wide-angle scanning planar phased array in X/Ku-bands," IEEE Trans. Antennas Propag., vol. 62, no. 5, pp. 2514-2521, May 2014.

[27] R.-L. Xia, S.-W. Qu, X. Bai, Q. Jiang, S. Yang, and Z.-P. Nie, "Experimental investigation of wide-angle impedance matching of phased array using overlapped feeding network," IEEE Antennas Wireless Propag., vol. 13, pp. 1284-1287, July 2014.

[28] J. A. Kasemodel, C. C. Chen, and J. L. Volakis, "Wideband planar array with integrated feed and matching network for wide-angle scanning," IEEE Trans. Antennas Propagat., vol. 61, pp. 4528-4537, September 2013.

[29] M. Li, S. Q. Xiao, and B. Z. Wang, "Investigation of using high impedance surfaces for wide-angle scanning arrays," IEEE Trans. Antennas Propagat., vol. 63, pp. 2895-2901, July 2015.

[30] D. Sievenpiper, L. Zhang, R. F. J. Broas, N. G. Alexopoulos, and E. Yablonovitch, "High-impedance electromagnetic surfaces with a forbidden frequency band," IEEE Trans. Microwave Theory and Techniques, vol. 47, pp. 2059-2074, November 1999.

[31] F. R. Yang, K. P. Ma, Y. Qian, and T. Itoh, "A novel TEM waveguide using uniplanar compact photonic-bandgap (UC-PBG) structure," IEEE Trans. Microwave Theory and Techniques, vol. 47, pp. 2092-2098, November 1999.

[32] H. Y. D. Yang, R. Ki, and D. R. Jackson, "Design consideration for modeless integrated circuit substrates using planar periodic patches," IEEE Trans. Microwave Theory and Techniques, vol. 48, pp. 2233-2239, December 2000.

[33] C. A. Kyriazidou, H. F. Contopanagos, and N. G. Alexopoulos, "Space-frequency projection of planar AMCs on integrated for 60 GHz radios," IEEE Trans. Antennas Propagat., vol. 60, pp. 1899-1909, April 2012.

[34] A. Vallecchi, J. R. De Luis, F. Capolino, and F. De Flaviis, "Low profile fully planar folded dipole antenna on a high impedance surface," IEEE Trans. Antennas Propagat., vol. 60, pp. 51-62, January 2012.

[35] N. G. Alexopoulos and D. R. Jackson "Fundamental superstrate (cover) effects on printed circuit antennas," IEEE Trans. Antennas Propag., vol. 32, pp. 807-816, August 1984.

[35] D. F. Sievenpiper, "Forward and backward leaky wave radiation with large effective aperture from an electronically tunable textured surface," IEEE Trans. Antennas Propagat., vol. 53, no. 1, pp. 236-247, January 2005.

[36] J. Liang and H.-Y. D. Yang, "Radiation characteristics of a microstrip patch over an electromagnetic bandgap surface," IEEE Trans. Antennas Propag., vol. 55, no. 6, pp. 1691-1697, June 2007.

[37] D. M. Pozar, "The active element pattern," IEEE Trans. Antennas Propagat., vol. 42, pp. 1176-1178, August 1994.

[38] D. F. Kelley and W. L. Stutzman "Array antenna pattern modeling methods that include mutual coupling effects," IEEE Trans. Antennas Propagat., vol. 41, pp. 1625-1632, December 1993.

[39] E. Adas, "Integrated microstrip antennas and phased arrays with mode-free electromagnetic bandgap materials for scan blindness elimination," PhD dissertation, University of California, Irvine, 2016.

[40] E. Adas, F. De Flaviis, N. G. Alexopoulos, "Integrated microstrip antennas and phased arrays with mode-free electromagnetic bandgap materials for scan blindness elimination," Electromagn., to be published.

[41] E. Adas, F. De Flaviis, N. G. Alexopoulos, "Mode-free electromagnetic bandgap materials with broadside radiation," IEEE Trans. Microw. Theory Tech., submitted.

[42] E. Adas, F. De Flaviis, N. G. Alexopoulos, "Scan analysis of finite-sized phased arrays based on mode-free radiating electromagnetic bandgap materials," IEEE Trans. Antennas Propag., submitted.

What is claimed is:

1. A bandgap-antenna structure (100) configured to operate as an antenna element integrating mode-free omnidirectional bandgap behavior to effectively eliminate effects of substrate waves, wherein said structure (100) comprises:
   (a) an antenna layer (103) disposed on a top surface of a solid cubic substrate (101) having a height, D, close to a half-wavelength of a bandgap frequency lying within a bandgap frequency region, wherein the antenna layer (103) comprises a metallic patch, having a square geometry, radiating energy from an excitation probe in a direction perpendicular to the bandgap-antenna structure (100), wherein a frequency of said energy is within a given antenna frequency region;
   (b) an upper embedded metallic layer (105), disposed within said substrate (101) below the antenna layer, comprising a first set of concentric metallic rings;
   (c) a lower embedded metallic layer (107), electrically coupled to and disposed below the upper embedded metallic layer (105) within the substrate (101), comprising a second set of concentric metallic rings; and
   (d) a backing ground plane (109) operatively coupled to a bottom surface of the substrate (101), wherein the backing ground plane (109) is electrically coupled to the lower embedded metallic layer (107) via a plurality of vias (111),
wherein the antenna layer (103), the upper and lower embedded metallic layers (105,107), and the backing ground plane (109) are aligned such that a center of each is disposed along an axis normal to the substrate (101), wherein the given antenna frequency region and the bandgap frequency region overlap so that said mode-free omnidirectional bandgap behavior is exhibited during said energy radiation by said antenna layer (103).

2. The bandgap-antenna structure (100) of claim 1, wherein h1 is a distance between the antenna layer (103) and the upper embedded metallic layer (105), wherein h2 is a distance between the upper and lower embedded metallic layers (105,107), wherein h3 is a distance between the lower embedded metallic layer (107) and the backing ground plane, wherein h1, h2, and h3 are selected to obtain mode-free bandgap behavior at the selected bandgap frequency.

3. The bandgap-antenna structure (100) of claim 2, wherein h1 is selected to ensure that the antenna layer (103) is electrically uncoupled or disconnected from the upper and lower embedded metallic layers (105,107), thereby eliminating a degradation of radiation properties of the metallic patch.

4. The bandgap-antenna structure (100) of claim 1, wherein each ring in the first and second sets of concentric metallic rings has one or more gaps of a given width, w0, wherein each gap is positioned to allow each ring to be rotationally symmetric with all other rings, wherein the one or more gaps effectively optimize a radiation frequency response of said structure.

5. The bandgap-antenna structure (100) of claim 1, wherein said structure (100) is used as an antenna element in a phased array, wherein the structure (100) eliminates scan blindness along all directions as a result of said integrated mode-free omnidirectional bandgap behavior.

6. A bandgap-antenna array comprising two or more of the bandgap-antenna structures of claim 1, wherein said array operates as an antenna integrating said mode-free omnidirectional bandgap behavior.

7. A method for constructing a bandgap-antenna structure (100) configured to operate as an antenna element integrating mode-free omnidirectional bandgap behavior, wherein the method comprises:
   (a) operatively coupling an antenna layer (103), comprising a metallic patch having a square geometry, to a top surface of a substrate, wherein the substrate (101) is a solid cube having a height, D, close to half-wavelength of a phased array frequency that lies within a bandgap frequency region;
   (b) placing an upper embedded metallic layer (105) within the substrate a distance h1 below the antenna layer, wherein the upper embedded metallic layer (105) comprises a first set of concentric metallic rings;
   (c) placing a lower embedded metallic layer (107) within the substrate a distance h2 below the upper embedded metallic layer (105) such that the lower and upper metallic layers (105,107) are electrically coupled, wherein the lower embedded metallic layer (107) comprises a second set of concentric metallic rings;
   (d) operatively coupling a backing ground plane (109) to a bottom surface of the substrate at a distance h3 from a bottom surface of the lower embedded metallic layer (107), wherein the backing ground plane (109) is electrically coupled to the lower embedded metallic layer (107) via a plurality of vias (111),
wherein the antenna layer (103), the upper and lower embedded metallic layers (105,107), and the backing ground plane (109) are aligned such that a center of each is disposed along an axis normal to the substrate (101); and (e) feeding the metallic patch with energy within a given antenna frequency region via an excitation probe, which causes the metallic patch to radiate said energy in a direction perpendicular to the substrate (101), wherein the given antenna frequency region and the bandgap frequency region overlap so that mode-free omnidirectional bandgap behavior is exhibited during said energy radiation by said antenna layer (103).

8. The method of claim 7, wherein h1, h2, and h3 are selected to obtain mode-free bandgap behavior at the selected bandgap frequency.

9. The method of claim 7, wherein h1 is selected to ensure that the antenna layer (103) is electrically uncoupled or disconnected from the upper and lower embedded metallic layers (105,107), thereby eliminating a degradation of radiation properties of the metallic patch.

10. The method of claim 7, wherein each ring in the first and second sets of concentric metallic rings has one or more gaps of a given width, w0, wherein each gap is positioned to allow each ring to be rotationally symmetric with all other rings, wherein the one or more gaps effectively optimize a radiation frequency response of said structure.

11. The method of claim 7, wherein the bandgap-antenna structure (100) is used as an antenna element in a phased array, wherein the structure (100) eliminates scan blindness along all directions as a result of said integrated mode-free omnidirectional bandgap behavior.

12. A method of generating mode-free omnidirectional bandgap behavior in an antenna element, comprising:

(a) operatively coupling an antenna layer (103), comprising a metallic patch having a square geometry, to a top surface of a substrate, wherein the substrate (101) is a solid cube having a height, D, close to half-wavelength of a phased array frequency that lies within a bandgap frequency region;

(b) placing an upper embedded metallic layer (105) within the substrate a distance h1 below the antenna layer, wherein the upper embedded metallic layer (105) comprises a first set of concentric metallic rings;

(c) placing a lower embedded metallic layer (107) within the substrate a distance h2 below the upper embedded metallic layer (105) such that the lower and upper metallic layers (105,107) are electrically coupled, wherein the lower embedded metallic layer (107) comprises a second set of concentric metallic rings;

(d) operatively coupling a backing ground plane (109) to a bottom surface of the substrate at a distance h3 from a bottom surface of the lower embedded metallic layer (107), wherein the backing ground plane (109) is electrically coupled to the lower embedded metallic layer (107) via a plurality of vias (111), wherein the antenna layer (103), the upper and lower embedded metallic layers (105,107), and the backing ground plane (109) are aligned such that a center of each is disposed along an axis normal to the substrate (101); and (e) feeding the metallic patch with energy within a given antenna frequency region via an excitation probe, which causes the metallic patch to radiate said energy in a direction perpendicular to the substrate (101), wherein the given antenna frequency region and the bandgap frequency region overlap so that said mode-free omnidirectional bandgap behavior is exhibited during said energy radiation by said antenna layer (103).

13. The method of claim 12, wherein h1, h2, and h3 are selected to obtain mode-free bandgap behavior at the selected bandgap frequency.

14. The method of claim 12, wherein h1 is selected to ensure that the antenna layer (103) is electrically uncoupled or disconnected from the upper and lower embedded metallic layers (105,107), thereby eliminating a degradation of radiation properties of the metallic patch.

15. The method of claim 12, wherein each ring in the first and second sets of concentric metallic rings has one or more gaps of a given width, w0, wherein each gap is positioned to allow each ring to be rotationally symmetric with all other rings, wherein the one or more gaps effectively optimize a radiation frequency response of said antenna element.

16. The method of claim 12, wherein, when employed in a phased array, the antenna element eliminates scan blindness along all directions as a result of said mode-free omnidirectional bandgap behavior.

* * * * *